US012785247B2

(12) United States Patent
Lee et al.

(10) Patent No.: US 12,785,247 B2
(45) Date of Patent: Nov. 3, 2026

(54) ANTENNA AND ELECTRONIC DEVICE INCLUDING THE SAME

(71) Applicant: Samsung Electronics Co., Ltd., Suwon-si (KR)

(72) Inventors: Jonghyuck Lee, Suwon-si (KR); Taeik Kim, Suwon-si (KR); Haeyeon Kim, Suwon-si (KR); Sehyun Park, Suwon-si (KR); Dongjun Oh, Suwon-si (KR); Shinho Yoon, Suwon-si (KR); Myeongsu Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 547 days.

(21) Appl. No.: 18/324,657

(22) Filed: May 26, 2023

(65) Prior Publication Data

US 2023/0299460 A1 Sep. 21, 2023

Related U.S. Application Data

(63) Continuation of application No. 16/655,969, filed on Oct. 17, 2019, now Pat. No. 11,664,579.

(30) Foreign Application Priority Data

Oct. 24, 2018 (KR) ........................ 10-2018-0127259

(51) Int. Cl.

*H01Q 1/22* (2006.01)
*G06F 1/16* (2006.01)
(Continued)

(52) U.S. Cl.

CPC ......... *H01Q 1/2266* (2013.01); *G06F 1/1616* (2013.01); *H01Q 1/2291* (2013.01);
(Continued)

(58) Field of Classification Search

CPC .... H01Q 1/2266; H01Q 1/2291; H01Q 1/243; H04M 1/0216; H05K 1/118; G06F 1/1616
(Continued)

(56) References Cited

U.S. PATENT DOCUMENTS 11,664,579 B2 * 5/2023 Lee ...................... H01Q 1/2266 343/702
2003/0129950 A1 7/2003 Kwak
(Continued)

FOREIGN PATENT DOCUMENTS

CN 102549843 A 7/2012
CN 106711579 A 5/2017
(Continued)

OTHER PUBLICATIONS

Chinese Office Action dated Aug. 2, 2023, issued in Chinese Patent Application No. 201910991246.2.
(Continued)

*Primary Examiner* — Michael R Neff
(74) *Attorney, Agent, or Firm* — Jefferson IP Law, LLP

(57) ABSTRACT

An electronic device is provided. The electronic device includes a foldable housing, a flexible display, at least one printed circuit board (PCB), and a wireless communication circuit. The foldable housing includes a hinge structure, a first housing structure connected to the hinge structure and including a first surface facing in a first direction, a second surface facing in a direction opposite to the first direction, and a first lateral member surrounding a first space between the first surface and the second surface, and a second housing structure connected to the hinge structure and including a third surface facing in a second direction, a fourth surface facing in a direction opposite to the second
(Continued)

direction, and a second lateral member surrounding a second space between the third surface and the fourth surface.

21 Claims, 13 Drawing Sheets

(51) Int. Cl.
*H01Q 1/24* (2006.01)
*H04M 1/02* (2006.01)
*H05K 1/11* (2006.01)

(52) U.S. Cl.
CPC .......... *H01Q 1/243* (2013.01); *H04M 1/0216* (2013.01); *H05K 1/118* (2013.01)

(58) Field of Classification Search
USPC ....................................................... 455/575.3
See application file for complete search history.

(56) References Cited

U.S. PATENT DOCUMENTS

| | | | | |
|---|---|---|---|---|
| 2004/0106428 | A1* | 6/2004 | Shoji | H01Q 9/0421 455/575.7 |
| 2006/0194462 | A1* | 8/2006 | Hashizume | H01R 35/02 439/164 |
| 2007/0194994 | A1* | 8/2007 | Waltho | H01Q 1/2258 343/702 |
| 2010/0317415 | A1 | 12/2010 | Lee et al. | |
| 2011/0136447 | A1 | 6/2011 | Pascolini et al. | |
| 2012/0176293 | A1 | 7/2012 | Itho et al. | |
| 2012/0231750 | A1 | 9/2012 | Jin et al. | |
| 2013/0321216 | A1 | 12/2013 | Jervis et al. | |
| 2015/0261259 | A1* | 9/2015 | Endo | G06F 3/0446 361/679.06 |
| 2016/0064820 | A1 | 3/2016 | Kim et al. | |
| 2016/0254588 | A1 | 9/2016 | Kim et al. | |
| 2017/0047637 | A1 | 2/2017 | Kim et al. | |
| 2017/0117611 | A1 | 4/2017 | Lepe et al. | |
| 2017/0141820 | A1 | 5/2017 | Kim et al. | |
| 2017/0142241 | A1 | 5/2017 | Kim et al. | |
| 2017/0244149 | A1 | 8/2017 | Kim et al. | |
| 2017/0346164 | A1 | 11/2017 | Kim et al. | |
| 2018/0103132 | A1 | 4/2018 | Prushinskiy et al. | |
| 2018/0366813 | A1 | 12/2018 | Kim et al. | |
| 2019/0140342 | A1 | 5/2019 | Lim et al. | |
| 2019/0356051 | A1* | 11/2019 | Barrera | H01Q 1/44 |

FOREIGN PATENT DOCUMENTS

| | | | |
|---|---|---|---|
| CN | 107024964 | A | 8/2017 |
| CN | 107453040 | A | 12/2017 |
| CN | 107851887 | A | 3/2018 |
| CN | 107918451 | A | 4/2018 |
| CN | 108292796 | A | 7/2018 |
| CN | 108352601 | A | 7/2018 |
| EP | 3 343 693 | A1 | 7/2018 |
| JP | 2006-157787 | A | 6/2006 |
| JP | 2007-104493 | A | 4/2007 |
| KR | 10-2003-0061072 | A | 7/2003 |
| KR | 10-2004-0043876 | A | 5/2004 |
| KR | 10-2005-0122778 | A | 12/2005 |
| KR | 10-2013-0135089 | A | 12/2013 |
| KR | 10-2016-0027700 | A | 3/2016 |
| KR | 10-2017-0019838 | A | 2/2017 |
| KR | 10-2017-0056292 | A | 5/2017 |
| KR | 10-2017-0058749 | A | 5/2017 |
| KR | 10-2017-0066944 | A | 6/2017 |
| KR | 10-2017-0116262 | A | 10/2017 |
| KR | 10-2017-0120985 | A | 11/2017 |
| KR | 10-2017-0133952 | A | 12/2017 |

OTHER PUBLICATIONS

Extended European Search Report dated Sep. 1, 2023, issued in European Patent Application No. 23177343.3.
Indian Hearing Notice dated Jun. 5, 2024, issued in Indian Patent Application No. 202117011116.
International Search Report dated Jan. 23, 2020, issued in International Patent Application No. PCT/KR2019/013630.
European Search Report dated Feb. 24, 2020, issued in European Patent Application No. 19205077.1.
Korean Office Action dated Oct. 14, 2022, issued in Korean Patent Application No. 10-2018-0127259.
European Office Action dated Dec. 15, 2022, issued in European Patent Application No. 19 205 077.1.
Chinese Notice of Allowance dated Jan. 30, 2024, issued in Chinese Patent Application No. 201910991246.2.
Korean Office Action dated Mar. 2, 2024, issued in Korean Patent Application No. 10-2023-0095467.
Korean Notice of Allowance dated Jan. 21, 2025, issued in a Korean Patent Application No. 10-2023-0095467.
Indian Office Action dated Dec. 22, 2025, issued in Indian Application No. 202318023893.
European Search Report dated Jun. 9, 2026, issued in European Application No. 26164968.5.

* cited by examiner

Folder open

Folder colsed

ANTENNA AND ELECTRONIC DEVICE INCLUDING THE SAME

CROSS-REFERENCE TO RELATED APPLICATION(S)

This application is a continuation application of prior application Ser. No. 16/655,969, filed on Oct. 17, 2019, which is based on and claims priority under 35 U.S.C. 119 (a) of a Korean patent application number 10-2018-0127259, filed on Oct. 24, 2018, in the Korean Intellectual Property Office, the disclosure of which is incorporated by reference herein in its entirety.

BACKGROUND

1. Field

The disclosure relates to an antenna and an electronic device including the antenna.

2. Description of Related Art

With the growth of electronic communication technology, electronic devices having various functions and shapes have emerged. Such electronic devices generally have a convergence function that performs several functions in combination.

Some of recent electronic devices use a conductive member (e.g., a metal frame or metal bezel) to satisfy consumer needs and increase their rigidity. In case of a communication electronic device, at least a part of the conductive member is used as an antenna.

When the exterior of the electronic device is formed of such a conductive member, at least a part of the conductive member may be utilized as an antenna in order to meet a slimming trend of electronic devices. For example, when the conductive member used as a lateral member of the electronic device is utilized as the antenna, the conductive member is divided into segments and a non-conductive dielectric material fills a gap between the segments to electrically isolate a certain portion of the conductive member. By doing so, the electrical length of the antenna from a feeder can be adjusted, and therefore the antenna can be operated in a desired frequency band.

Meanwhile, the electronic device may be of a foldable type such that a pair of housing structures can be foldable with respect to each other through a hinge structure formed of a conductive material. If the antenna of the foldable electronic device is disposed near the conductive hinge structure, it is difficult to match a desired operating frequency band. Further, this may cause a shift of the operating frequency band.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an antenna and a foldable electronic device including the antenna.

Additional aspects will be set forth in part in the description which follows and, in part, will be apparent from the description, or may be learned by practice of the presented embodiments In accordance with an aspect of the disclosure, an antenna capable of exhibiting a specified radiation performance by using a conductive portion included in an electronic device is provided.

According to another aspect of the disclosure, an electronic device is provided. The electronic device includes a foldable housing, a flexible display, at least one printed circuit board (PCB), and a wireless communication circuit. The foldable housing includes a hinge structure, a first housing structure connected to the hinge structure and including a first surface facing in a first direction, a second surface facing in a direction opposite to the first direction, and a first lateral member surrounding a first space between the first surface and the second surface, and a second housing structure connected to the hinge structure and including a third surface facing in a second direction, a fourth surface facing in a direction opposite to the second direction, and a second lateral member surrounding a second space between the third surface and the fourth surface. The first lateral member includes a first conductive portion extending along the hinge structure, a second conductive portion extending substantially perpendicular to the first conductive portion, a third conductive portion extending substantially parallel to the first conductive portion, a first non-conductive portion connected between the first and second conductive portions, and a second non-conductive portion connected between the second and third conductive portions. The first and second housing structures are foldable along the hinge structure such that the first surface faces the third surface in a folded state and the second direction is equal to the first direction in an unfolded state. The flexible display includes a first conductive layer that extends from the first surface to the third surface. The at least one PCB is disposed in the first space and includes a second conductive layer forming an annular path together with a part of the first conductive portion, the first non-conductive portion, and a part of the second conductive portion. The wireless communication circuit is disposed on the at least one PCB and electrically connected to a first point of the first conductive portion on the annular path and to a second point of the second conductive portion outside the annular path.

According to another aspect of the disclosure, an electronic device is provided. The electronic device includes a foldable housing, a display, at least one printed circuit board (PCB), a wireless communication circuit, a switching element, and at least one processor. The foldable housing includes a conductive hinge structure, a first housing structure connected to the hinge structure and including a first surface facing in a first direction, a second surface facing in a direction opposite to the first direction, and a first lateral member surrounding a first space between the first surface and the second surface, and a second housing structure connected to the hinge structure and including a third surface facing in a second direction, a fourth surface facing in a direction opposite to the second direction, and a second lateral member surrounding a second space between the third surface and the fourth surface. The first lateral member includes a first conductive portion extending along the hinge structure at least in part, a second conductive portion extending from the first conductive portion, a third conductive portion extending from the second conductive portion, a first non-conductive portion connected between the first and second conductive portions, and a second non-conductive portion connected between the second and third conductive portions. The first and second housing structures are foldable such that the first surface faces the third surface in a folded state and the second direction is equal to the first direction in an unfolded state. The display extends from at least a part of the first surface to at least a part of the third surface. The at least one PCB is disposed in the first space and includes a conductive layer forming an annular path together with a part of the first conductive portion, the first non-conductive portion, and a part of the second conductive portion. The wireless communication circuit is disposed on the at least one PCB and electrically connected to a first point of the first conductive portion on the annular path and to a second point of the second conductive portion outside the annular path. The switching element is disposed on the PCB and selectively and electrically connected between the conductive layer and a third point of the second conductive portion so as to selectively form the annular path. The at least one processor controls the switching element to selectively determine the annular path according to state information of the electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
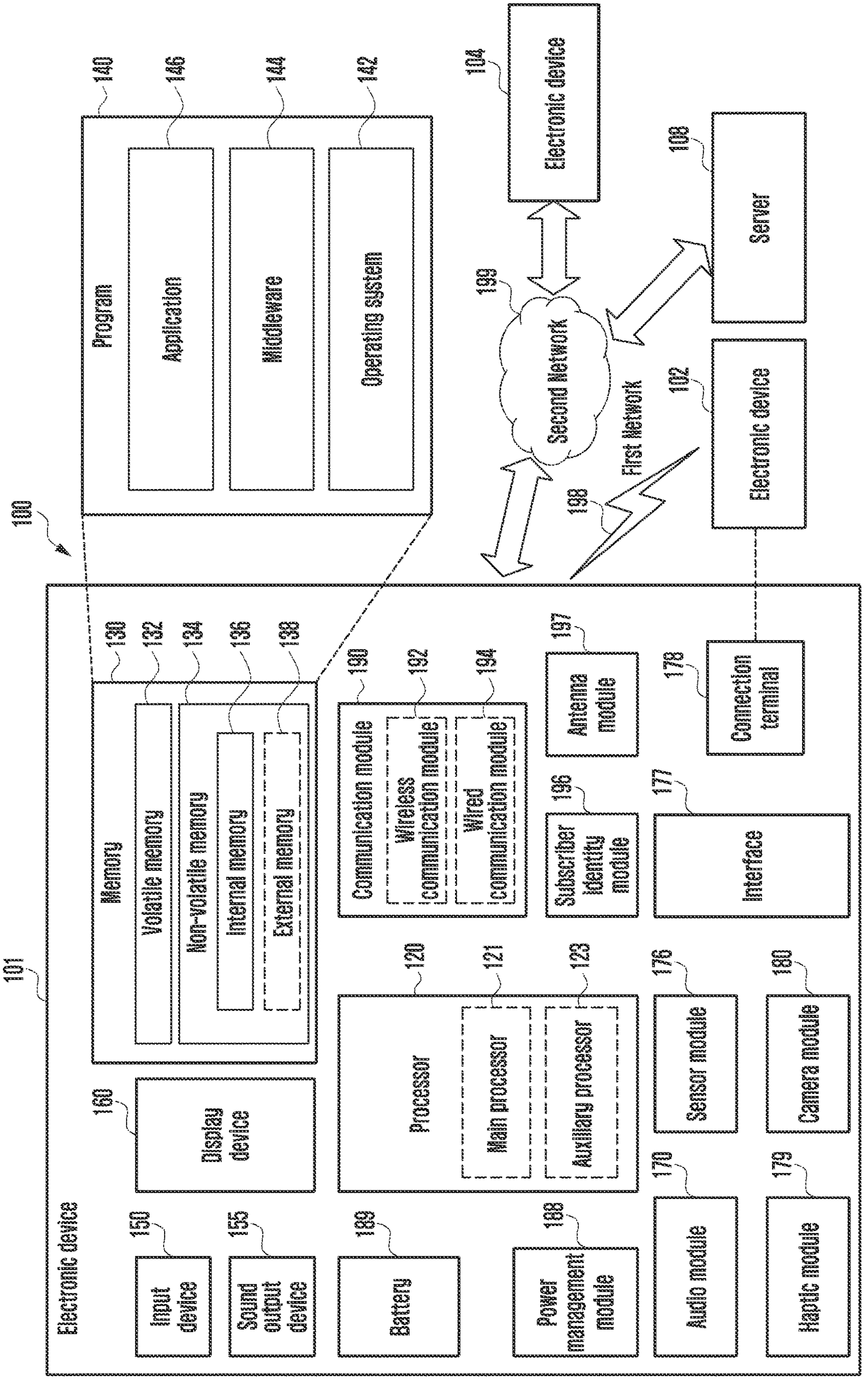
FIG. 1 is a block diagram illustrating an electronic device in a network environment according to an embodiment of the disclosure.

FIG. 1 is a block diagram of an electronic device in a network environment according to an embodiment of the disclosure.

Referring to FIG. 1, in a network environment 100, an electronic device 101 may communicate with a first external electronic device 102 through a first network 198 (e.g., short-range wireless communication network) or may communicate with a second external electronic device 104 or a server 108 through a second network 199 (e.g., long-distance wireless communication network). In one embodiment, the electronic device 101 may communicate with the second external electronic device 104 through the server 108. According to an embodiment, the electronic device 101 may include a processor 120, a memory 130, an input unit 150, a sound output unit 155, a display unit 160, an audio module 170, a sensor module 176, an interface 177, a haptic module 179, a camera module 180, a power management module 188, a battery 189, a communication module 190, a subscriber identification module 196, and an antenna module 197. In one embodiment, at least one component (e.g., the display unit 160 or the camera module 180) among the components of the electronic device 101 may be omitted, or other components may be added to the electronic device 101. In one embodiment, some of these components may be implemented as an integrated circuit. For example, the sensor module 176 (e.g., fingerprint sensor, iris sensor, or illuminance sensor) may be embedded in the display unit 160 (e.g., display).

The processor 120 may execute, for example, software (e.g., a program 140) to control at least one of other components (e.g., hardware component or software component) of the electronic device 101 connected to the processor 120, and may process a variety of data or perform various computations. In one embodiment, as part of data processing or computation, the processor 120 may load a command or data received from other components (e.g., the sensor module 176 or the communication module 190) into the volatile memory 132, process the command or data stored in the volatile memory 132, and store the result data in nonvolatile memory 134. In one embodiment, the processor 120 may include a main processor 121 (e.g., central processing unit, or application processor), and a secondary processor 123 (e.g., graphics processing unit, image signal processor, sensor hub processor, or communication processor), which may operate independently of or in cooperation with the main processor 121. Additionally or alternatively, the secondary processor 123 may consume less power or may be more specialized in a specific function compared with the main processor 121. The secondary processor 123 may be implemented separately from or as part of the main processor 121.

The secondary processor 123 may control at least some of the functions or states associated with at least one component (e.g., the display unit 160, the sensor module 176, or the communication module 190) among the components of the electronic device 101, for example, instead of the main processor 121 while the main processor 121 is in an inactive (e.g., sleep) state, or together with the main processor 121 while the main processor 121 is in an active (e.g., application execution) state. In one embodiment, the secondary processor 123 (e.g., image signal processor or communication processor) may be implemented as a part of another component (e.g., the camera module 180 or the communication module 190) that is functionally related to the secondary processor 123.

The memory 130 may store a variety of data used by at least one component (e.g., the processor 120 or the sensor module 176) of the electronic device 101. The data may include, for example, software (e.g., the program 140) and input data or output data for commands associated with the software. The memory 130 may include the volatile memory 132 or the nonvolatile memory 134.

The programs 140 may be stored in the memory 130 as software, and may include, for example, an operating system 142, a middleware 144, or an application 146.

The input unit 150 may receive a command or data, which can be to be used for a component (e.g., the processor 120) of the electronic device 101, from the outside of the electronic device 101 (e.g., user). The input unit 150 may include, for example, a microphone, a mouse, a keyboard, or a digital pen (e.g., stylus pen).

The sound output unit 155 may output a sound signal to the outside of the electronic device 101. The sound output unit 155 may include, for example, a speaker and a receiver. The speaker may be used for general purposes, such as playback of multimedia or recordings, and the receiver may be used for receiving an incoming call. In one embodiment, the receiver may be implemented separately from or as part of the speaker.

The display unit 160 may visually present information to the outside of the electronic device 101 (e.g., user). The display unit 160 may include, for example, a display, a hologram device, or a projector, and a control circuit for controlling these. In one embodiment, the display unit 160 may include a touch circuitry configured to sense a touch, or a sensing circuitry (e.g., pressure sensor) configured to measure the strength of a force caused by a touch action.

The audio module 170 may convert a sound into an electric signal or convert an electric signal into a sound. In one embodiment, the audio module 170 may obtain a sound signal through the input unit 150 or may output a sound signal through an external electronic device (e.g., the first external electronic device 102 (e.g., speaker or headphone)) wiredly or wirelessly connected to the sound output unit 155 or the electronic device 101.

The sensor module 176 may generate an electrical signal or a data value corresponding to the operating state (e.g., power or temperature) of the electronic device 101 or the environmental state (e.g., user state) outside the electronic device 101. The sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support one or more designated protocols that enable the electronic device 101 to directly or wirelessly connect to an external electronic device (e.g., the first external electronic device 102). In one embodiment, the interface 177 may include, for example, a high-definition multimedia interface (HDMI), a universal serial bus (USB) interface, an SD card interface, or an audio interface.

The connection terminal 178 may include a connector through which the electronic device 101 can be physically connected to an external electronic device (e.g., the first external electronic device 102). In one embodiment, the connection terminal 178 may include, for example, an HDMI connector, a USB connector, a secure digital (SD) card connector, or an audio connector (e.g., headphone connector).

The haptic module 179 may convert an electrical signal into a mechanical stimulus (e.g., vibration or motion) or an electrical stimulus that can be perceived by the user through tactile or kinesthetic senses. In one embodiment, the haptic module 179 may include, for example, a motor, a piezoelectric element, or an electric stimulator.

The camera module 180 may capture a still image or a moving image. In one embodiment, the camera module 180 may include at least one lens, an image sensor, an image signal processor, or a flash.

The power management module 188 may manage the power supplied to the electronic device 101. The power management module 188 may be implemented as part of a power management integrated circuit (PMIC).

The battery 189 may supply power to at least one component of the electronic device 101. In one embodiment, the battery 189 may include, for example, a non-rechargeable primary cell, a rechargeable secondary cell, or a fuel cell.

The communication module 190 may establish a wired or wireless communication channel between the electronic device 101 and the external electronic device (e.g., the first external electronic device 102, the second external electronic device 104, or the server 108) and support communication through the established communication channel. The communication module 190 may include at least one communication processor that can operate separately from the processor 120 (e.g., application processor) to support wired or wireless communication. In one embodiment, the communication module 190 may include a wireless communication module 192 (e.g., cellular communication module, short-range wireless communication module, or global navigation satellite system (GNSS) communication module), or a wired communication module 194 (e.g., local area network (LAN) communication module, or power line communication module). The corresponding communication module may communicate with an external electronic device through the first network 198 (e.g., short-range communication network such as Bluetooth, Wi-Fi direct, or infrared data association (IrDA)) or through the second network 199

(e.g., long-distance communication network such as a cellular network, the Internet, or a computer network like a LAN or WAN). The above various communication modules may be implemented as one component (e.g., single chip) or as separate components (e.g., multiple chips). The wireless communication module 192 may identify and authenticate the electronic device 101 in the communication network such as the first network 198 or the second network 199 by using subscriber information stored in the subscriber identification module 196.

The antenna module 197 may transmit or receive a signal or power to or from the outside (e.g., the external electronic devices 102 or 104). In one embodiment, the antenna module 197 may include one antenna having a radiator made of a conductor or conductive pattern formed on a substrate (e.g., PCB). In one embodiment, the antenna module 197 may include a plurality of antennas. In this case, at least one antenna suitable for the communication scheme used in the communication network such as the first network 198 or the second network 199 may be selected from the plurality of antennas by, for example, the communication module 190. The signal or power may be transmitted or received between the communication module 190 and the external electronic devices 102 or 104 through the selected at least one antenna. In one embodiment, in addition to the radiator, another component (e.g., radio frequency integrated circuit (RFIC)) may be further formed as part of the antenna module 197.

At least some of the above components may be connected to each other via a communication scheme between peripherals (e.g., bus, general purpose input and output (GPIO), serial peripheral interface (SPI), or mobile industry processor interface (MIPI)), and may exchange signals (e.g., commands or data) with each other.

In one embodiment, commands or data may be exchanged between the electronic device 101 and the second external electronic device 104 through the server 108 connected to the second network 199. The external electronic devices 102 and 104 may be of the same type as or a different type from the electronic device 101. In one embodiment, all or some of the operations that can be performed by the electronic device 101 may be performed by one or more of the external electronic devices 102, 104 and 108. For example, to perform a certain function or service automatically or upon request, the electronic device 101 may, instead of or in addition to executing the function or service, request one or more external electronic devices to execute at least some of the function or service. Upon reception of the request, the external electronic devices may execute at least a portion of the requested function or service or an additional function or service related to the request, and return the execution results to the electronic device 101. The electronic device 101 may further process the received results if necessary and provide the processing results as a response to the requested function or service. To this end, technologies such as cloud computing, distributed computing, and client-server computing may be used.

The electronic device according to various embodiments disclosed herein can be one of various types of devices, such as portable communication devices (e.g., smartphones), computers, portable multimedia devices, portable medical instruments, cameras, wearable devices, and home appliances. However, the electronic device is not limited to the above-mentioned devices.

It should be understood that the various embodiments of the disclosure and the terminology used herein are not intended to limit the techniques described herein to specific embodiments but to include various modifications, equivalents, and/or alternatives thereof. In the drawings, the same or similar reference symbols are used to refer to the same or like parts. In the description, the singular forms "a", "an" and "the" are intended to include the plural forms as well, unless the context clearly indicates otherwise. In the description, the expression "A or B", "at least one of A and/or B", "A, B or C", or "at least one of A, B and/or C" may indicate all possible combinations of the listed items. The terms "first" and "second" may refer to various elements regardless of importance and/or order and are used to distinguish one element from another element without limitation. It will be understood that when an element (e.g., first element) is referred to as being (functionally or communicatively) "coupled with/to" or "connected with/to" another element (e.g., second element), it can be coupled or connected with/to the other element directly (wiredly), wirelessly, or via a third element.

In the description, the term "module" may refer to a certain unit that is implemented in hardware, software, firmware, or a combination thereof. The term "module" may be used interchangeably with the term "unit", "logic", "logical block", "component", or "circuit", for example. The module may be the minimum unit, or a part thereof, which performs one or more particular functions. For example, a module may be implemented in the form of an application-specific integrated circuit (ASIC).

Various embodiments of the disclosure may be implemented in software (e.g., the programs 140) including instructions stored in a machine-readable storage medium (e.g., internal memory 136 or external memory 138) readable by a machine (e.g., the electronic device 101). For example, the processor (e.g., the processor 120) of the machine (e.g., the electronic device 101) can fetch a stored instruction from a storage medium and execute the fetched instruction. When the instruction is executed by the processor, the machine may perform the function corresponding to the instruction. The instructions may include a code generated by a compiler and a code executable by an interpreter. The machine-readable storage medium may be provided in the form of a non-transitory storage medium. Here, "non-transitory" means that the storage medium does not include a signal and is tangible, but does not distinguish whether data is stored semi-permanently or temporarily in the storage medium.

The method according to various embodiments disclosed herein may be provided as a computer program product. A computer program product may be traded between a seller and a purchaser as a commodity. A computer program product may be distributed in the form of a machine-readable storage medium (e.g., compact disc read only memory (CD-ROM)) or be distributed online (e.g., download or upload) directly between two user devices (e.g. smartphones) through an application store (e.g., PlayStore™). For on-line distribution, at least a portion of the computer program product may be temporarily stored or temporarily created in a storage medium such as a memory of a manufacturer's server, an application store's server, or a relay server.

Each of the components (e.g., modules or programs) according to various embodiments described above may be composed of one or more elements. An existing component may be omitted, and a new component may be added. Alternatively or additionally, some of the components (e.g., modules or programs) may be combined into one entity while maintaining the same functionality. Operations supported by a module, program, or another component may be carried out in sequence, in parallel, by repetition, or heuristically. Some operations may be executed in a different order or may be omitted, and a new operation may be added.

Figure 2A:
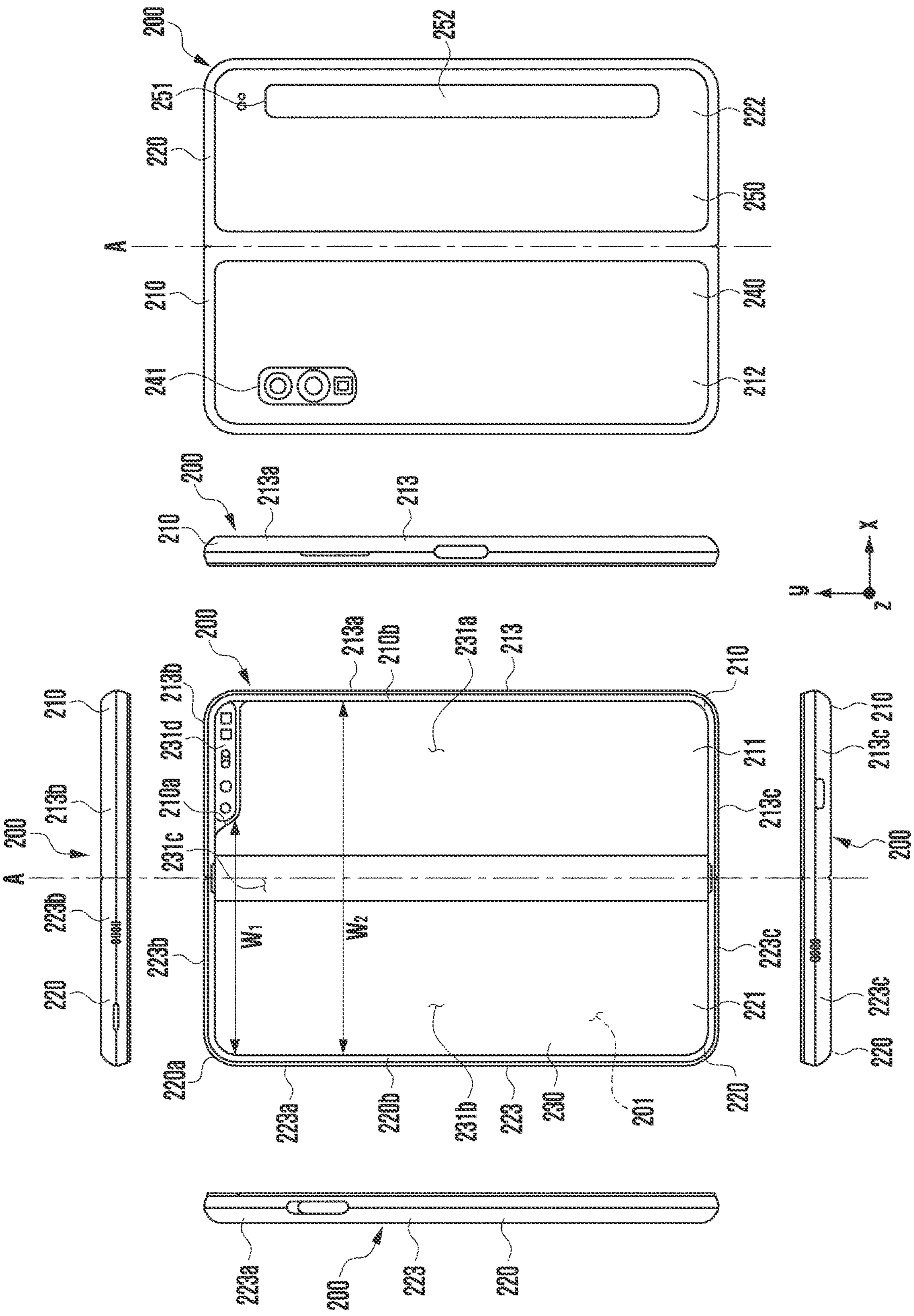
FIG. 2A is a view illustrating an electronic device in a flat state according to an embodiment of the disclosure.

FIG. 2A is a view illustrating an electronic device in a flat state according to an embodiment of the disclosure.

Figure 2B:
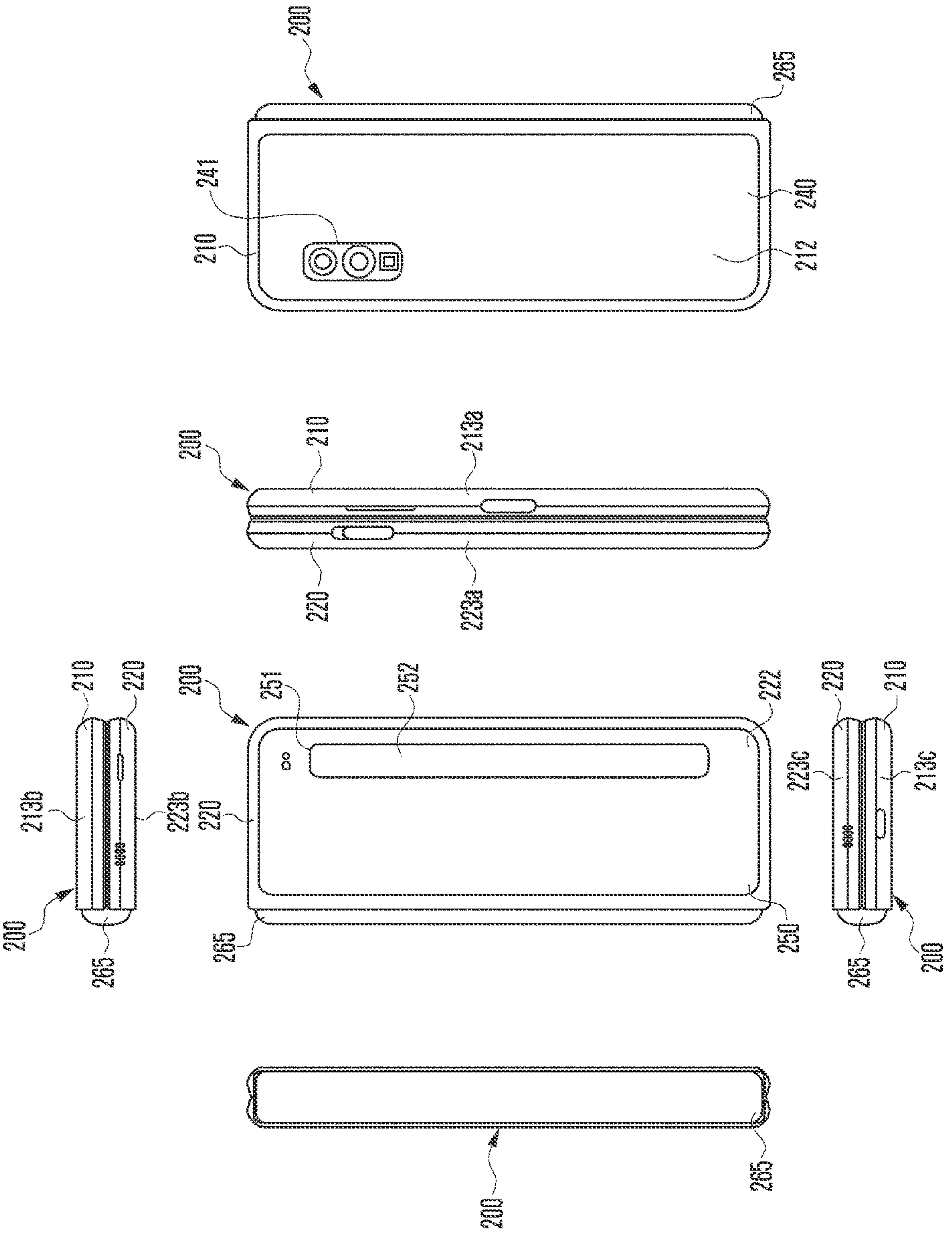
FIG. 2B is a view illustrating an electronic device in a folded state according to an embodiment of the disclosure.

FIG. 2B is a view illustrating an electronic device in a folded state according to an embodiment of the disclosure.

Embodiments for an electronic device of FIGS. 2A and 2B may be at least partially similar to or different from those for the electronic device 101 of FIG. 1.

Referring to FIG. 2A, an electronic device 200 may include a pair of housing structures 210 and 220 rotatably coupled via a hinge structure (e.g., hinge structure 264 in FIG. 3) to be folded relative to each other, a hinge cover 265 covering the foldable portion of the pair of housing structures 210 and 220, and a display 230 (e.g., flexible display or foldable display) disposed in the space formed by the pair of housing structures 210 and 220. In the description, the surface on which the display 230 is disposed may be referred to as the front surface of the electronic device 200, and the opposite side of the front surface may be referred to as the rear surface of the electronic device 200. The surface surrounding the space between the front surface and the rear surface may be referred to as the side surface of the electronic device 200.

In one embodiment, the pair of housing structures 210 and 220 may include a first housing structure 210 including a sensor region 231*d*, a second housing structure 220, a first rear cover 240, and a second rear cover 250. The pair of housing structures 210 and 220 of the electronic device 200 are not limited to the shape or combination illustrated in FIGS. 2A and 2B, but may be implemented in various shapes or combinations. For example, in another embodiment, the first housing structure 210 and the first rear cover 240 may be formed as a single body, and the second housing structure 220 and the second rear cover 250 may be formed as a single body.

In one embodiment, the first housing structure 210 and the second housing structure 220 may be disposed at both sides with respect to the folding axis (A) and may be substantially symmetrical with respect to the folding axis (A). In one embodiment, the angle or distance between the first housing structure 210 and the second housing structure 220 may vary depending upon whether the electronic device 200 is in the flat state or closed state, the folded state, or the intermediate state. In one embodiment, the first housing structure 210 includes the sensor region 231*d* where various sensors are disposed, but may have a symmetrical shape with the second housing structure 220 in other regions. In another embodiment, the sensor region 231*d* may be disposed in a specific region of the second housing structure 220 or may be replaced.

In one embodiment, during the flat state of the electronic device 200, the first housing structure 210 may be connected to the hinge structure (e.g., hinge structure 264 in FIG. 3), and may include a first surface 211 facing the front surface of the electronic device 200, a second surface 212 facing away from the first surface 211, and a first side member 213 enclosing at least a portion of the space between the first surface 211 and the second surface 212. In one embodiment, the first side member 213 may include a first side surface 213*a* disposed in parallel with the folding axis (A), a second side surface 213*b* extending from one end of the first side surface 213*a* in a direction perpendicular to the folding axis, and a third side surface 213*c* extending from the other end of the first side surface 213*a* in a direction perpendicular to the folding axis.

In one embodiment, during the flat state of the electronic device 200, the second housing structure 220 may be connected to the hinge structure (e.g., hinge structure 264 in FIG. 3), and may include a third surface 221 facing the front surface of the electronic device 200, a fourth surface 222 facing away from the third surface 221, and a second side member 223 enclosing at least a portion of the space between the third surface 221 and the fourth surface 222. In one embodiment, the second side member 223 may include a fourth side surface 223*a* disposed in parallel with the folding axis (A), a fifth side surface 223*b* extending from one end of the fourth side surface 223*a* in a direction perpendicular to the folding axis, and a sixth side surface 223*c* extending from the other end of the fourth side surface 223*a* in a direction perpendicular to the folding axis. In one embodiment, the third surface 221 may face the first surface 211 in the folded state.

In one embodiment, the electronic device 200 may include a recess 201 formed to accommodate the display 230 through a structural combination of the shapes of the first housing structure 210 and the second housing structure 220. The recess 201 may have substantially the same size as the display 230. In one embodiment, the recess 201 may have two or more different widths in a direction perpendicular to the folding axis (A) due to the sensor region 231*d*. For example, the recess 201 may have a first width (W1) between a first portion 220*a* of the second housing structure 220 parallel to the folding axis (A) and a first portion 210*a* of the first housing structure 210 formed at the edge of the sensor region 231*d*, and have a second width (W2) between a second portion 220*b* of the second housing structure 220 and a second portion 210*b* of the first housing structure 210 that does not correspond to the sensor region 213*d* and is parallel to the folding axis (A). Here, the second width (W2) may be wider than the first width (W1). In other words, the recess 201 may be formed to have the first width (W1) ranging from the first portion 210*a* of the first housing structure 210 to the first portion 220*a* of the second housing structure 220 (asymmetric shape), and the second width (W2) ranging from the second portion 210*b* of the first housing structure 210 to the second portion 220*b* of the second housing structure 220 (symmetric shape). In one embodiment, the first portion 210*a* and the second portion 210*b* of the first housing structure 210 may be located at different distances from the folding axis (A). The width of the recess 201 is not limited to the example shown above. In various embodiments, the recess 201 may have two or more different widths owing to the shape of the sensor region 213*d* or the asymmetry of the first housing structure 210 or the second housing structure 220.

In one embodiment, at least a portion of the first housing structure 210 and the second housing structure 220 may be made of a metal or non-metal material having a rigidity value selected to support the display 230.

In one embodiment, the sensor region 231*d* may be formed to have a preset area near to one corner of the first housing structure 210. However, the arrangement, shape, or size of the sensor region 231*d* is not limited to the illustrated example. For example, in a certain embodiment, the sensor region 231*d* may be formed at another corner of the first housing structure 210 or in any region between the upper corner and the lower corner. In another embodiment, the sensor region 231*d* may be disposed at a portion of the second housing structure 220. In another embodiment, the sensor region 231*d* may be formed to extend between the first housing structure 210 and the second housing structure 220. In one embodiment, to perform various functions, the electronic device 200 may include components exposed to the front surface of the electronic device 200 through the sensor region 213*d* or through one or more openings provided in the sensor region 231*d*. The components may include, for example, at least one of a front camera, a receiver, a proximity sensor, an illuminance sensor, an iris recognition sensor, an ultrasonic sensor, or an indicator.

In one embodiment, the first rear cover 240 may be disposed on the second surface 212 of the first housing structure 210 and may have a substantially rectangular periphery. In one embodiment, at least a portion of the periphery may be wrapped by the first housing structure 210. Similarly, the second rear cover 250 may be disposed on the fourth surface 222 of the second housing structure 220, and at least a portion of the periphery thereof may be wrapped by the second housing structure 220.

In the illustrated embodiment, the first rear cover 240 and the second rear cover 250 may have a substantially symmetrical shape with respect to the folding axis (A). In another embodiment, the first rear cover 240 and the second rear cover 250 may have various different shapes. In another embodiment, the first rear cover 240 may be formed as a single body with the first housing structure 210, and the second rear cover 250 may be formed as a single body with the second housing structure 220.

In one embodiment, the first rear cover 240, the second rear cover 250, the first housing structure 210, and the second housing structure 220 may be combined with each other so as to provide a space where various components (e.g., printed circuit board, antenna module, sensor module, and battery) of the electronic device 200 can be arranged. In one embodiment, one or more components may be disposed on or visually exposed via the rear surface of the electronic device 200. For example, one or more components or sensors may be visually exposed through the first rear region 241 of the first rear cover 240. The sensors may include a proximity sensor, a rear camera, and/or a flash. In another embodiment, at least a portion of the sub-display 252 may be visually exposed through the second rear region 251 of the second rear cover 250.

The electronic device 200 may be disposed on the space formed by the pair of housing structures 210 and 220. For example, the electronic device 200 may be seated in the recess (e.g., recess 201 in FIG. 2A) formed by the pair of housing structures 210 and 220, and may be disposed to substantially occupy most of the front surface of the electronic device 200. Hence, the front surface of the electronic device 200 may include the display 230, a portion (e.g., edge region) of the first housing structure 210 close to the display 230, and a portion (e.g. edge region) of the second housing structure 220 close to the display 230. In one embodiment, the rear surface of the electronic device 200 may include the first rear cover 240, a portion (e.g., edge region) of the first housing structure 210 close to the first rear cover 240, the second rear cover 250, and a portion (e.g. edge region) of the second housing structure 220 close to the second rear cover 250.

In one embodiment, the display 230 may refer to a display whose at least a portion may be deformed into a flat or curved surface. In one embodiment, the display 230 may include a folding region 231*c*, a first region 231*a* disposed on one side (e.g., right side of the folding region 231*c*) with respect to the folding region 231*c*, and a second region 231*b* disposed on the other side (e.g., left side of the folding region 231*c*). For example, the first region 231*a* may be disposed on the first surface 211 of the first housing structure 210, and the second region 231*b* may be disposed on the third surface 221 of the second housing structure 220. This demarcation of the display 230 is only an example, and the display 230 may be subdivided into plural regions (e.g., four or more regions) according to the structure or functionality. For example, in the embodiment of FIG. 2A, the area of the display 230 may be subdivided with respect to the folding region 231*c* or the folding axis (A) extending parallel to the y-axis. However, in another embodiment, the area of the display 230 may be subdivided with respect to a different folding region (e.g., folding region parallel to the x-axis) or a different folding axis (e.g., folding axis parallel to the x-axis). The aforementioned subdivision of the display is only a physical demarcation based on the pair of housing structures 210 and 220 and the hinge structure (e.g., hinge structure 264 in FIG. 3), and the display 230 may substantially present one full screen through the pair of housing structures 210 and 220 and the hinge structure (e.g., hinge structure 264 in FIG. 3). In one embodiment, the first region 231*a* and the second region 231*b* may have a symmetrical shape with respect to the folding region 231*c*. Although the first region 231*a* may include a notch region (e.g., notch region 233 in FIG. 3) cut according to the presence of the sensor region 231*d*, it may have a symmetrical shape with the second region 231*b* in other portions. In other words, the first region 231*a* and the second region 231*b* may include portions with symmetrical shapes and portions with asymmetrical shapes.

Figure 3:
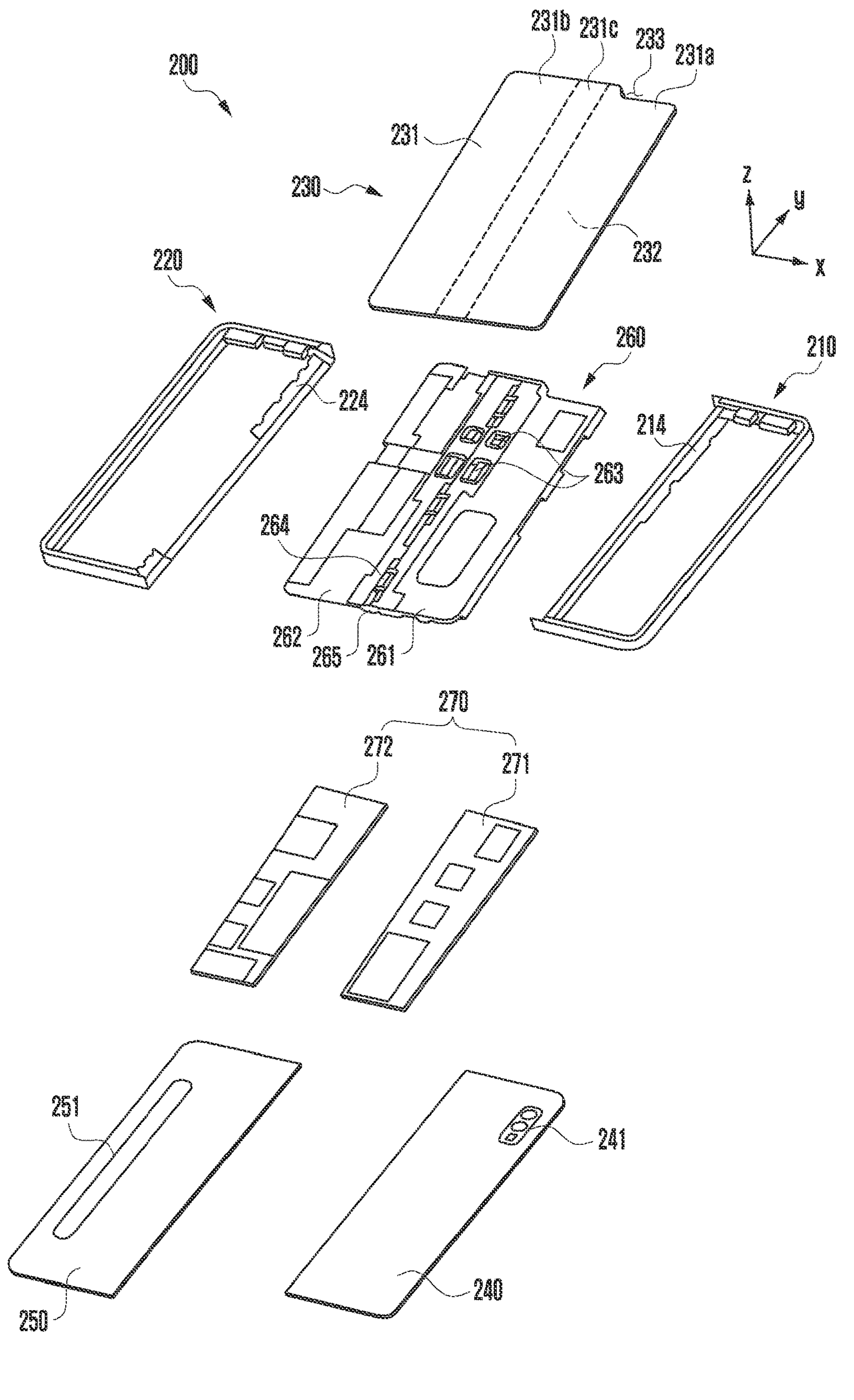
FIG. 3 is an exploded perspective view of an electronic device according to an embodiment of the disclosure.

Referring to FIG. 2B, the hinge cover 265 may be disposed between the first housing structure 210 and the second housing structure 220 so as to cover the internal components (e.g., hinge structure 264 in FIG. 3). In one embodiment, the hinge cover 265 may be covered by portions of the first housing structure 210 and the second housing structure 220 or be exposed to the outside according to the operating state (e.g., flat state or folded state) of the electronic device 200.

For example, when the electronic device 200 is in the flat state as illustrated in FIG. 2A, the hinge cover 265 may be covered by the first housing structure 210 and the second housing structure 220 so as not to be exposed. When the electronic device 200 is in the folded state (e.g., completely folded state) as illustrated in FIG. 2B, the hinge cover 265 may be exposed to the outside between the first housing structure 210 and the second housing structure 220. When the electronic device 200 is in the intermediate state where the first housing structure 210 and the second housing structure 220 make a certain angle, the hinge cover 265 may be partially exposed to the outside between the first housing structure 210 and the second housing structure 220. In this case, the exposed portion may be less than that for the fully folded state. In one embodiment, the hinge cover 265 may include a curved surface.

Next, a description is given of configurations of the first housing structure 210 and the second housing structure 220 and regions of the display 230 according to the operating state (e.g. flat state or folded state) of the electronic device 200.

In one embodiment, when the electronic device 200 is in the flat state (e.g., state of FIG. 2A), the first housing structure 210 and the second housing structure 220 may make an angle of 180 degrees, and the first region 231*a* and the second region 231*b* of the display may be disposed to face in the same direction. In addition, the folding region 231*c* may be coplanar with the first region 231*a* and the second region 231*b*.

In one embodiment, when the electronic device 200 is in the folded state (e.g., state of FIG. 2B), the first housing structure 210 and the second housing structure 220 may be disposed to face each other. The first region 231*a* and the second region 231*b* of the display 230 may face each other, making a narrow angle (e.g., between 0 degrees and 10 degrees). At least a portion of the folding region 231*c* may form a curved surface with a preset curvature.

In one embodiment, when the electronic device 200 is in the intermediate state, the first housing structure 210 and the second housing structure 220 may be disposed to make a certain angle. The first region 231*a* and the second region 231*b* of the display 230 may form an angle greater than that for the folded state and less than that for the flat state. At least a portion of the folding region 231*c* may form a curved surface with a preset curvature. This curvature may be less than that for the folded state.

FIG. 3 is an exploded perspective view of an electronic device according to an embodiment of the disclosure.

Referring to FIG. 3, in one embodiment, the electronic device 200 may include a display 230, a support member assembly 260, at least one printed circuit board 270, a first housing structure 210, a second housing structure 220, a first rear cover 240, and a second rear cover 250. In the description, the display 230 may be referred to as a display unit, display module, or display assembly.

The display 230 may include a display panel 231 (e.g., flexible display panel), and at least one plate 232 or layer on which the display panel 231 is seated. In one embodiment, the plate 232 may be disposed between the display panel 231 and the support member assembly 260. The display panel 231 may be disposed on at least a portion of one surface (e.g., surface in the Z direction in FIG. 3) of the plate 232. The plate 232 may be formed in a shape corresponding to the display panel 231. For example, a portion of the plate 232 may be formed in a shape corresponding to the notch region 233 of the display panel 231.

The support member assembly 260 may include a first support member 261, a second support member 262, a hinge structure 264 disposed between the first support member 261 and the second support member 262, a hinge cover 265 to cover the hinge structure 264 when viewed from the outside, and a wiring member 263 (e.g., flexible printed circuit board (FPCB)) that crosses the first support member 261 and the second support member 262.

In one embodiment, the support member assembly 260 may be disposed between the plate 232 and at least one printed circuit board 270. For example, the first support member 261 may be disposed between the first region 231*a* of the display 230 and the first printed circuit board 271. The second support member 262 may be disposed between the second region 231*b* of the display 230 and the second printed circuit board 272.

In one embodiment, at least a portion of the wiring member 263 and the hinge structure 264 may be disposed within the support member assembly 260. The wiring member 263 may be disposed in a direction crossing the first support member 261 and the second support member 262 (e.g., x-axis direction). The wiring member 263 may be disposed in a direction (e.g., x-axis direction) perpendicular to the folding axis (e.g., y-axis or folding axis (A) in FIGS. 2A and 2B) of the folding region 231*c*.

The at least one printed circuit board 270 may include, as described above, the first printed circuit board 271 disposed on the side of the first support member 261, and the second printed circuit board 272 disposed on the side of the second support member 262. The first printed circuit board 271 and the second printed circuit board 272 may be disposed inside the space formed by the support member assembly 260, the first housing structure 210, the second housing structure 220, the first rear cover 240, and the second rear cover 250. Various components for implementing functions of the electronic device 200 may be mounted on the first printed circuit board 271 and the second printed circuit board 272.

In one embodiment, in a state where the display 230 is coupled to the support member assembly 260, the first housing structure 210 and the second housing structure 220 may be assembled to each other so as to be coupled to both sides of the support member assembly 260. As described below, the first housing structure 210 and the second housing structure 220 may be coupled to the support member assembly 260 by being slid on both sides of the support member assembly 260.

In one embodiment, the first housing structure 210 may include a first rotary support surface 214, and the second housing structure 220 may include a second rotary support surface 224 corresponding to the first rotary support surface 214. The first rotary support surface 214 and the second rotary support surface 224 may include a curved surface corresponding to the curved surface included in the hinge cover 265.

In one embodiment, when the electronic device 200 is in the flat state (e.g., state of FIG. 2A), the first rotary support surface 214 and the second rotary support surface 224 may cover the hinge cover 265 so that the hinge cover 265 may be not or minimally exposed to the rear surface of the electronic device 200. When the electronic device 200 is in the folded state (e.g., state of FIG. 2B), the first rotary support surface 214 and the second rotary support surface 224 may rotate along the curved surface included in the hinge cover 265 so that the hinge cover 265 may be maximally exposed to the rear surface of the electronic device 200.

According to various embodiments of the disclosure, even when a conductive hinge structure is applied, it is possible to realize an excellent antenna performance and a shift to a designated frequency band by using at least a portion of the hinge structure. Hereinafter, the antenna will be described in detail.

Figure 4:
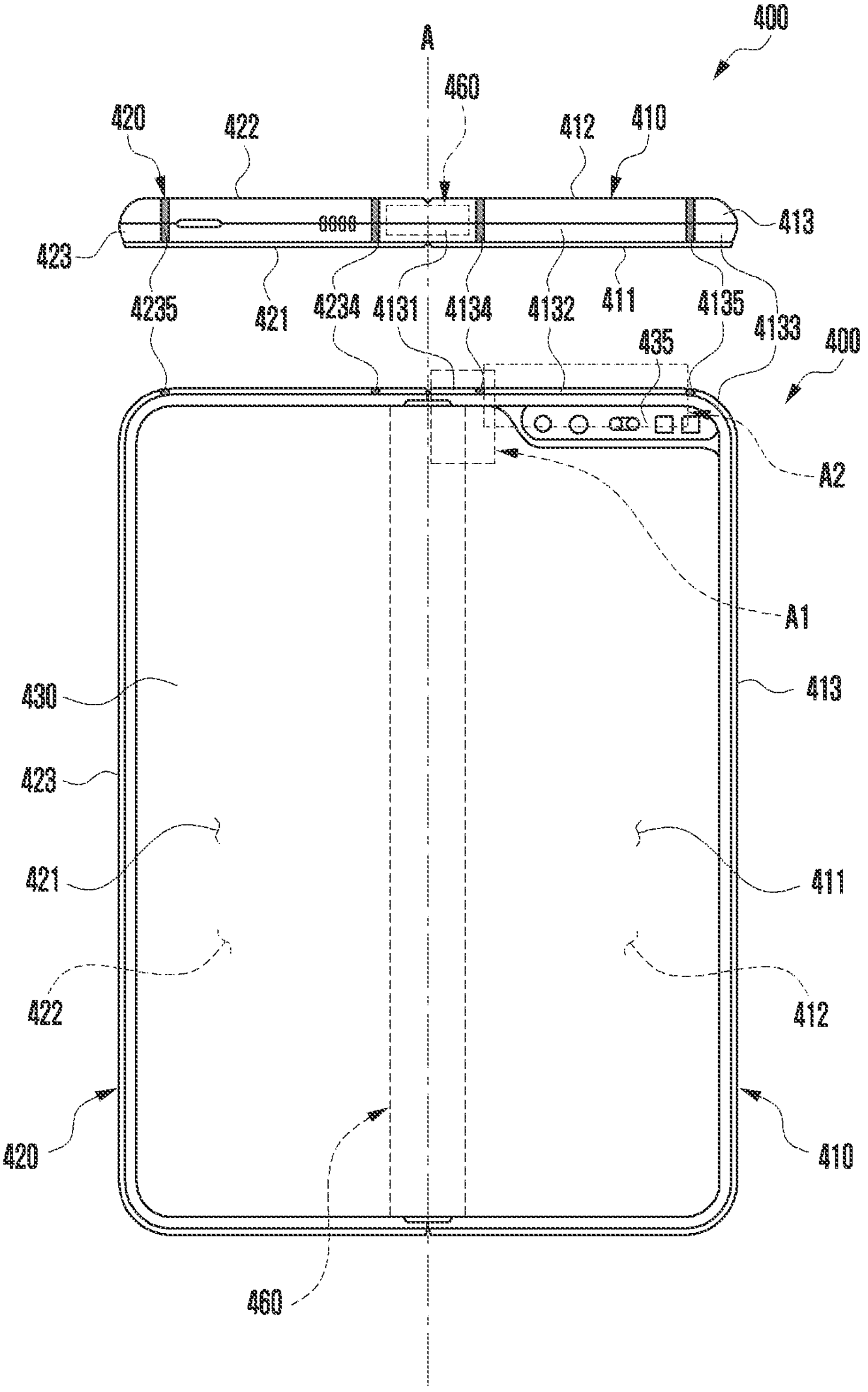
FIG. 4 is a view illustrating an electronic device including a segment structure according to an embodiment of the disclosure.

FIG. 4 is a view illustrating an electronic device including a segment structure according to an embodiment of the disclosure.

The electronic device of FIG. 4 may be similar, at least in part, to the electronic device 101 of FIG. 1 or the electronic device 200 of FIGS. 2A to 3, or may include other embodiments of the electronic device.

Referring to FIG. 4, an electronic device 400 may include foldable housing structures 410 and 420 rotatably disposed with respect to a folding axis (A). In an embodiment, the foldable housing structures may include a first housing structure 410 and a second housing structure 420. In an embodiment, the first housing structure 410 and the second housing structure 420 may be rotatably connected through a hinge structure 460 (e.g., the hinge structure 264 in FIG. 3). For example, the first housing structure 410 and the second housing structure 420 may be folded to face each other about the folding axis (A) through the hinge structure 460 or be unfolded to have the same plane.

According to various embodiments, the first housing structure 410 may include a first surface 411 facing in a first direction (e.g., a positive direction of the Z-axis in FIG. 3), a second surface 412 facing in a direction (e.g., a negative direction of the Z-axis in FIG. 3) opposite to the first direction, and a first lateral member 413 surrounding, at least in part, a first space (e.g., a first space 4130 in FIG. 5A) between the first surface 411 and the second surface 412. In an embodiment, at least a part of the first lateral member 413 may be formed of a conductive material (e.g., a metallic material).

According to various embodiments, the first lateral member 413 may include a first conductive portion 4131 extending along the hinge structure 460, a second conductive portion 4132 extending substantially perpendicular to the first conductive portion 4131, a third conductive portion 4133 extending substantially parallel to the first conductive portion 4131, a first non-conductive portion connected between the first and second conductive portions 4131 and 4132, and a second non-conductive portion 4135 connected between the second and third conductive portions 4132 and 4133. In an embodiment, the first conductive portion 4131 generally extends along the hinge structure 460, but at least a part of the first conductive portion 4131 may extend in a direction parallel to the second conductive portion 4132. In an embodiment, the third conductive portion 4133 generally extends parallel to the first conductive portion 4131, but at least a part of the third conductive portion 4133 may extend in a direction parallel to the second conductive portion 4132. In an embodiment, the first and second non-conductive portions 4134 and 4135 are formed of an insulating material, and the second conductive portion 4132 forming a unit segment is electrically isolated from the other portions of the first lateral member 413. In an embodiment, at least a part of the first conductive portion 4131 may be in physical contact with the hinge structure 460 formed of a conductive material, thereby maintaining an electrically connected state.

According to various embodiments, the second housing structure 420 may include a third surface 421 facing in a second direction (e.g., a positive direction of the Z-axis in FIG. 3), a fourth surface 422 facing in a direction (e.g., a negative direction of the Z-axis in FIG. 3) opposite to the second direction, and a second lateral member 423 surrounding, at least in part, a second space between the third surface 421 and the fourth surface 422. In an embodiment, at least a part of the second lateral member 423 may be formed of a conductive material. In an embodiment, the second lateral member 423 may include a third non-conductive portion 4234 and a fourth non-conductive portion 4235 which are disposed to face the first and second non-conductive portions 4134 and 4135 of the first housing structure 410, respectively, when the first and second housing structures 410 and 420 are folded.

According to various embodiments, when the first and second housing structures 410 and 420 are unfolded to form an angle of 180 degrees, the first surface 411 and the third surface 421 may face the same direction (e.g., the positive direction of the Z-axis in FIG. 3) and thus form a planar structure. In an embodiment, the electronic device 400 may include a flexible display (i.e., display 430) that includes a first conductive layer (e.g., a conductive plate or a Cu plate) disposed to cross the first surface 411 of the first housing structure 410 and the third surface 421 of the second housing structure 420. When the first surface 411 of the first housing structure 410 and the third surface 421 of the second housing structure 420 are folded to face each other, the flexible display (i.e., display 430) may also be folded to face each other about the folding axis (A). In an embodiment, at least a part of the first surface 411 of the first housing structure 410 may not include the display 430 such that a sensor area 435 can be disposed. In another embodiment, the sensor area 435 may be disposed in at least a part of the third surface 421 of the second housing structure 420 or disposed in both the first and third surfaces 411 and 421.

According to various embodiments, the electronic device 400 may include a pair of antennas A1 and A2 formed using an upper region of the first lateral member 413 of the first housing structure 410. In an embodiment, the first antenna A1 may be formed using at least a part of the first conductive portion 4131 electrically connected to the hinge structure 460. In an embodiment, the second antenna A2 may be formed using at least a part of the second conductive portion 4132. In an embodiment, the first antenna A1 may operate in a frequency band relatively higher than that of the second antenna A2.

Figure 5A:
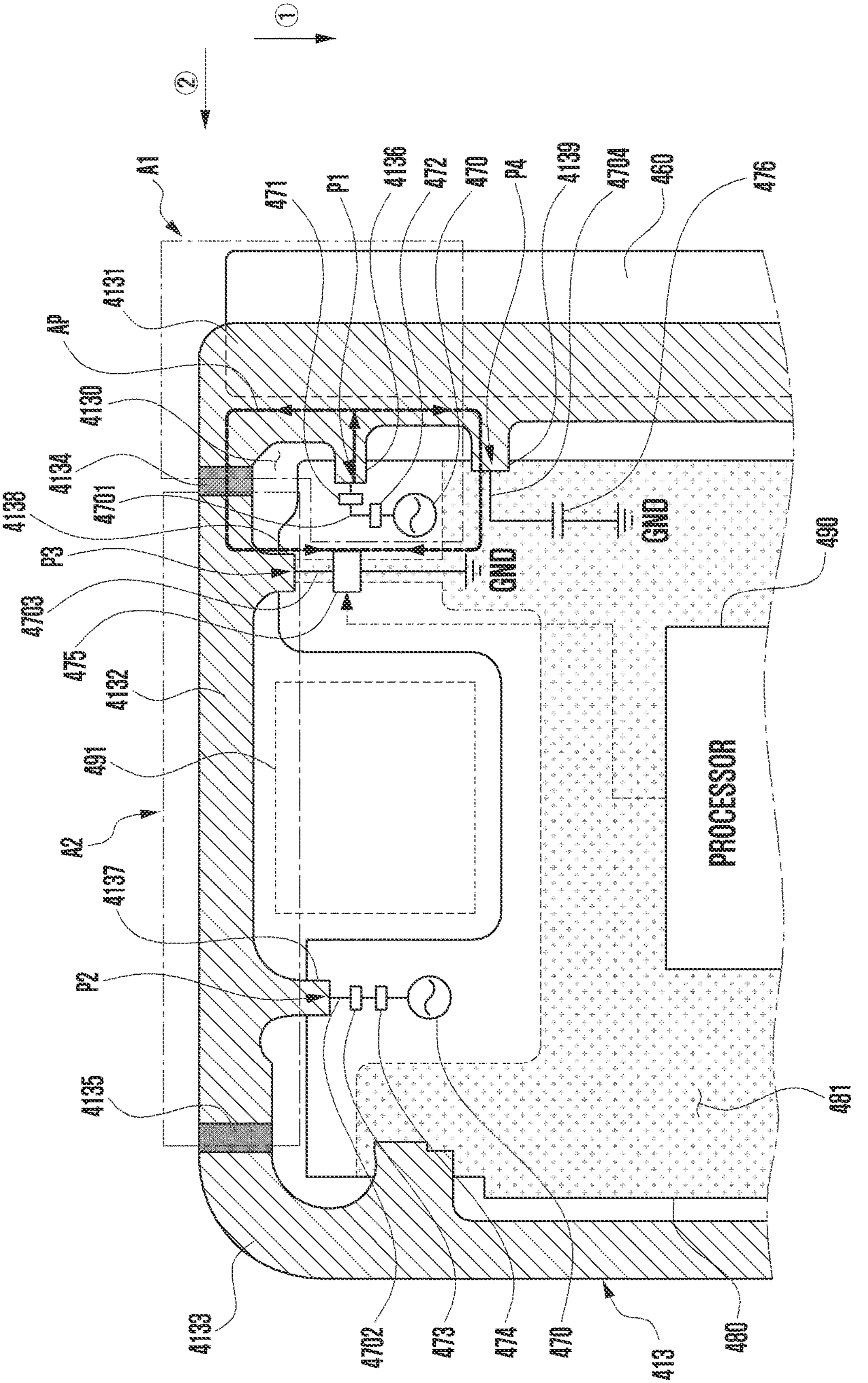
FIG. 5A is a view illustrating an arrangement relationship of antennas in an electronic device according to an embodiment of the disclosure.
Figure 5B:
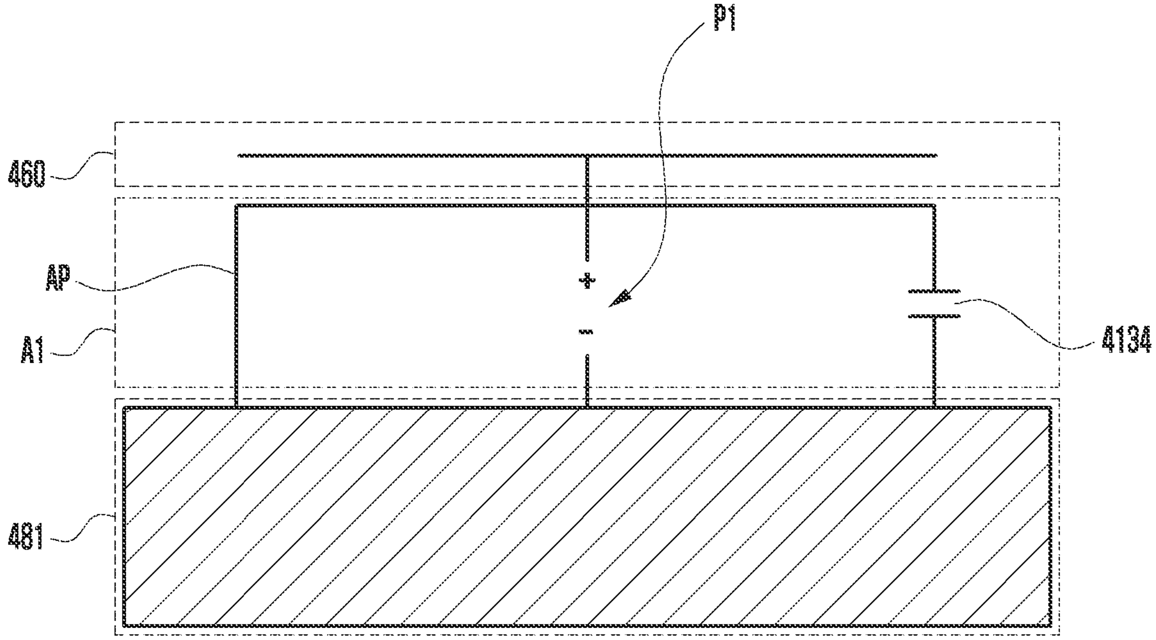
FIG. 5B is a view schematically illustrating a structure of a first antenna according to an embodiment of the disclosure.

According to various embodiments, the first antenna A1 may operate as a slot antenna using an annular path (e.g., an annular path (AP) in FIGS. 5A and 5B) formed by the hinge structure 460 electrically connected to the first conductive portion 4131, peripheral conductors (e.g., a part of the first conductive portion 4131), the first non-conductive portion 4134, the second conductive portion 4132, and a conductive layer (e.g., a second conductive layer 481 in FIGS. 5A and 5B) of a printed circuit board (e.g., a printed circuit board 480 in FIG. 5A). In an embodiment, the first antenna A1 can prevent the radiation performance from being degraded because of using the conductive hinge structure 460 as a part of the antenna, and may be formed to shift the operating frequency to a desired band by selecting the presence or absence of a slot.

FIG. 5A is a view showing an arrangement relationship of antennas in an electronic device according to an embodiment of the disclosure.

FIG. 5B is a view schematically illustrating a structure of a first antenna according to an embodiment of the disclosure.

Figure 5C:
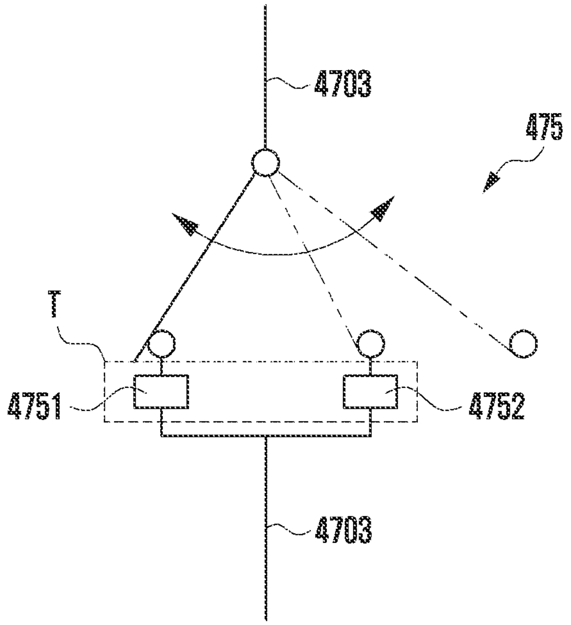
FIG. 5C is a view illustrating a configuration of a switching element according to an embodiment of the disclosure.

FIG. 5C is a view illustrating a configuration of a switching element according to an embodiment of the disclosure.

An electronic device of FIG. 5A may be similar, at least in part, to the electronic device 101 of FIG. 1 or the electronic device 200 of FIGS. 2A to 3, or may include other embodiments of the electronic device.

FIG. 5A shows a structure of the antennas A1 and A2 when the second surface (e.g., the second surface 412 in FIG. 4) of the first housing structure 410 is viewed from above.

Referring to FIGS. 5A, 5B and 5C, an electronic device 400 may include the first lateral member 413 disposed in the first housing structure (e.g., the first housing structure 410 in FIG. 4). In an embodiment, the first lateral side member 413 may be rotatably connected to the second lateral member (e.g., the second lateral member 423 in FIG. 4) of the second housing structure (e.g., the second housing structure 420 in FIG. 4) through the hinge structure 460.

According to various embodiments, the first lateral member 413 may include the first conductive portion 4131 extending in the first direction (direction 1) along the hinge structure 460, the second conductive portion 4132 extending in the second direction (direction 2) to be substantially perpendicular to the first conductive portion 4131, the third conductive portion 4133 extending in the first direction to be substantially parallel to the first conductive portion 4131, the first non-conductive portion 4134 connected between the first and second conductive portions 4131 and 4132, and the second non-conductive portion 4135 connected between the second and third conductive portions 4132 and 4133.

According to various embodiments, the electronic device 400 may include the first antenna A1 formed using at least a part of the first conductive portion 4131, and the second antenna A2 formed using at least a part of the second conductive portion 4132. In an embodiment, the first antenna A1 may operate in a frequency band relatively higher than that of the second antenna A2.

According to various embodiments, the electronic device 400 may include a printed circuit board (PCB) 480 disposed in the first space 4130 of the first lateral member 413. In an embodiment, the PCB 480 may include a second conductive layer 481 having a certain size. In an embodiment, the second conductive layer 481 may operate as a ground plane electrically connected to the first lateral member 413.

According to various embodiments, the electronic device 400 may include a plurality of connecting pieces 4136, 4137, 4138, and 4139 respectively extending from the first lateral member 413 and overlapped with at least a portion of the PCB 480 when the second surface (e.g., the second surface 412 in FIG. 4) is viewed from above. In an embodiment, the plurality of connecting pieces 4136, 4137, 4138, and 4139 may include a first connecting piece 4136 extending to a first point P1 of the first conductive portion 4131, a second connecting piece 4137 extending to a second point P2 of the second conductive portion 4132, a third connecting piece 4138 extending to a third point P3 of the second conductive portion 4132 wherein the third point P3 is disposed closer to the first non-conductive portion 4134 than the first point P1, and/or a fourth connecting piece 4139 extending to a fourth point P4 of the first conductive portion 4131 wherein the fourth point P4 is disposed farther from the first non-conductive portion 4134 than the first point P1. In an embodiment, when the PCB 480 is mounted in the first space 4130, the plurality of connecting pieces 4136, 4137, 4138, and 4139 may be electrically connected to the PCB 480. In another embodiment, each of the plurality of connecting pieces 4136, 4137, 4138, and 4139 may be electrically connected to the PCB 480 through a separate electrical connection member (e.g., a C-clip or a conductive contact).

According to various embodiments, the PCB 480 may have a first electrical path 4701 (e.g., a wiring line) that electrically connects, at the first point P1, the first connecting piece 4136 to a wireless communication circuit 470 disposed on the PCB 480. In an embodiment, at least one matching circuit 471 for impedance matching of the first antenna A1 may be disposed on the first electrical path 4701. In addition, at least one electric shock preventing circuit 472 for preventing electric shock and performing electrostatic discharge (ESD) may be disposed on the first electrical path 4701 because the PCB 480 is in direct electrical contact with the first lateral member 413 that forms at least a part of the exterior of the electronic device 400.

According to various embodiments, the PCB 480 may have a second electrical path 4702 (e.g., a wiring line) that electrically connects, at the second point P2, the second connecting piece 4137 to the wireless communication circuit 470 disposed on the PCB 480. In an embodiment, at least one matching circuit 473 for impedance matching of the second antenna A2 may be disposed on the second electrical path 4702. In addition, at least one electric shock preventing circuit 474 may be disposed on the second electrical path 4702.

According to various embodiments, the PCB 480 may have a third electrical path 4703 (e.g., a wiring line) that electrically connects, at the third point P3, the third connecting piece 4138 to the second conductive layer 481 disposed on the PCB 480. In an embodiment, at least one switching element 475 for selectively and electrically connecting the third connecting piece 4138 to the second conductive layer 481 may be disposed on the third electrical path 4703 in order to change the operating frequency band of the first antenna A1. In an embodiment, as illustrated in FIG. 5C, the switching element 475 may be configured to disconnect the third connecting piece 4138 and the second conductive layer 481 or to be electrically connected to a variable circuit T including one or more passive elements 4751 and 4752 (e.g., R, L or C) disposed on the third electrical path 4703.

According to various embodiments, the PCB 480 may have a fourth electrical path 4704 (e.g., a wiring line) that electrically connects, at the fourth point P4, the fourth connecting piece 4139 to the second conductive layer 481 disposed on the PCB 480. In an embodiment, the PCB 480 may further have at least one electric shock preventing capacitor 476 disposed on the fourth electrical path 4704.

According to various embodiments, the first antenna A1 may operate as a slot antenna having an electrical length of $\lambda/2$ by using a conductive annular path (AP) formed by a part of the first conductive portion 4131, the first non-conductive portion 4134, a part of the second conductive portion 4132, and a part of the second conductive layer 481. In this case, the third connecting piece 4138 disposed at the third point P3 may maintain a state of being electrically connected to the second conductive layer 481 of the PCB 480 through the switching element 475. In an embodiment, the first conductive portion 4131 and the second conductive portion 4132, which are isolated from each other by the first non-conductive portion 4134, may be arranged to have a capacitively coupled interval so as to operate as a capacitor component at a relatively high frequency. In an embodiment, when the third connecting piece 4138 and the second conductive layer 481 are electrically disconnected through the switching element 475, the first antenna A1 may operate in another designated frequency band. For example, when the second antenna A2 is opened through the switching element 475 or matched to have a specified impedance through the variable element T, the second antenna A2 may operate in a lower frequency band by an extended slot area formed through a conductive electronic component 491 (e.g., a speaker module, a microphone module, a camera device, a card slot, or a conductive structure) disposed near the second conductive portion 4132. Accordingly, the first antenna A1 may change the operating frequency band through a selective electrical connection between the third connecting piece 4138 and the second conductive layer 481 under the control of the switching element 475. Although not shown, the annular path (AP) may be formed when the third connecting piece 4138 is electrically connected to the second conductive layer 481 even when the first and second conductive portions 4131 and 4132 are connected without the first non-conductive portion 4134. In this case, the first antenna A1 may operate in a relatively higher frequency band than case where there is the first non-conductive portion 4134.

According to various embodiments, the processor 490 may change the operating frequency band of the first antenna A1 by detecting state information (e.g., region information or channel information) of the electronic device 400 through one or more sensors disposed in the electronic device 400, determining a current frequency mode based on the detected state information, and controlling the switching element 475 according to the determined frequency mode.

Figure 6A:
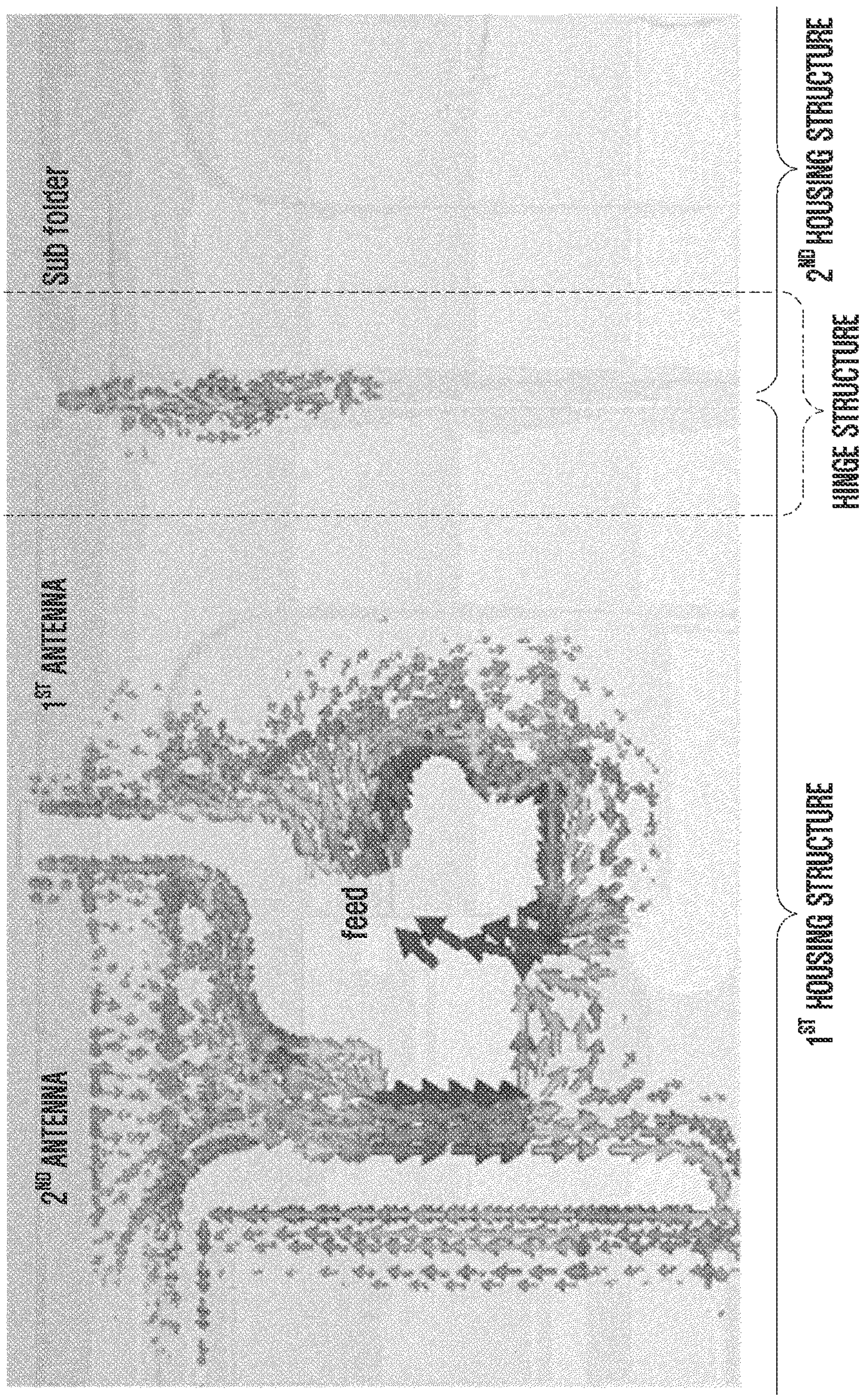
FIGS. 6A and 6B illustrate a current distribution of a first antenna in an electronic device illustrated in FIG. 5A according to various embodiments of the disclosure.
Figure 6B:
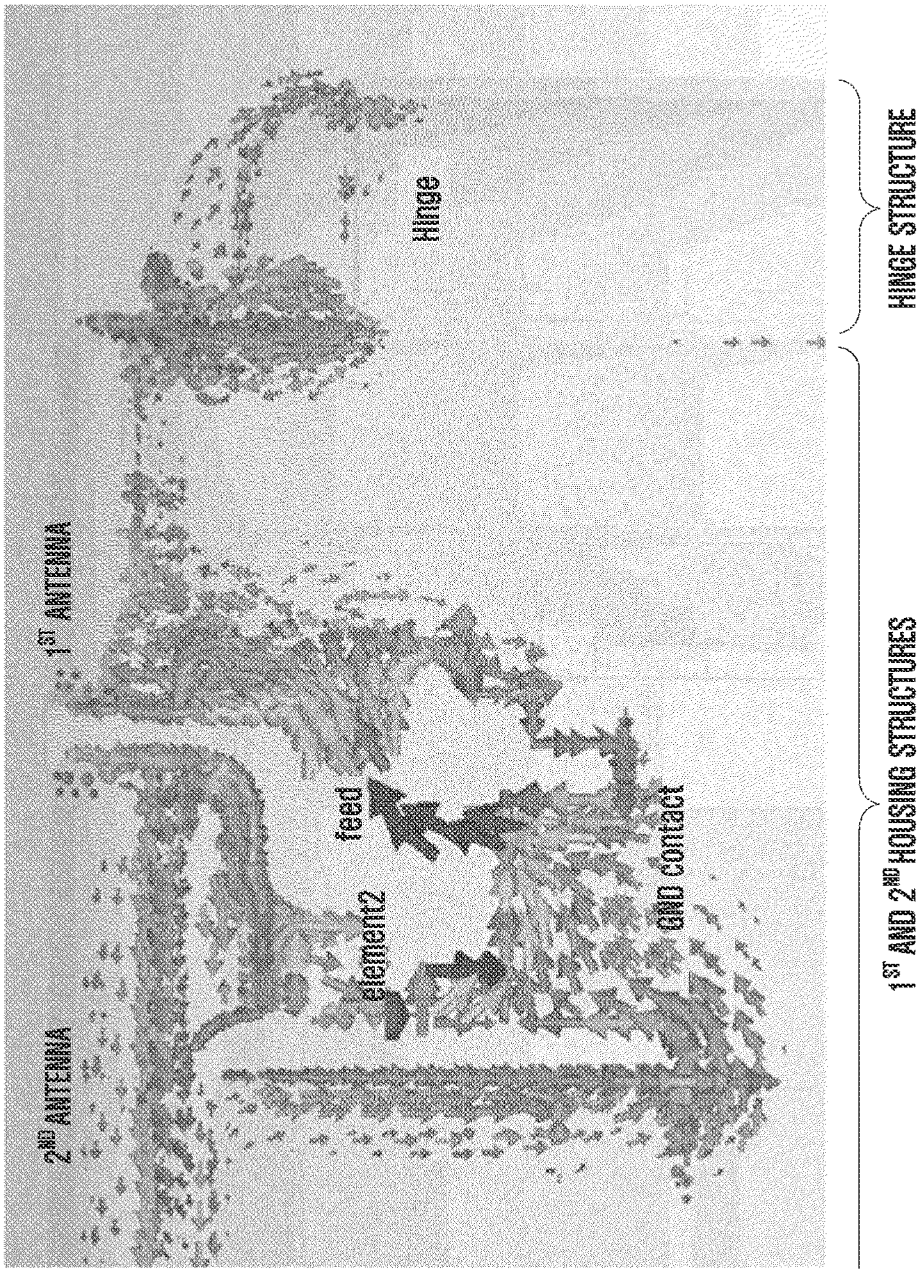

FIGS. 6A and 6B illustrate a current distribution of a first antenna in an electronic device illustrated in FIG. 5A according to various embodiments of the disclosure.

Referring to FIGS. 6A and 6B, when a first housing structure (e.g., the first housing structure 410 in FIG. 4) and a second housing structure (e.g., the second housing structure 420 in FIG. 4) are unfolded (see FIG. 6A) or folded (see FIG. 6B), a first antenna (e.g., the first antenna A1 in FIG. 5A) operates as a slot antenna because an annular path (e.g., the annular path AP in FIG. 5A) is formed through a second conductive layer (e.g., the second conductive layer 481 in FIG. 5A) electrically connected to a third connecting piece (e.g., the third connecting piece 4138 in FIG. 5A), a hinge structure (e.g., the hinge structure 460 in FIG. 5A), and a first conductive portion (e.g., the first conductive portion 4131 in FIG. 5A).

Figure 7:
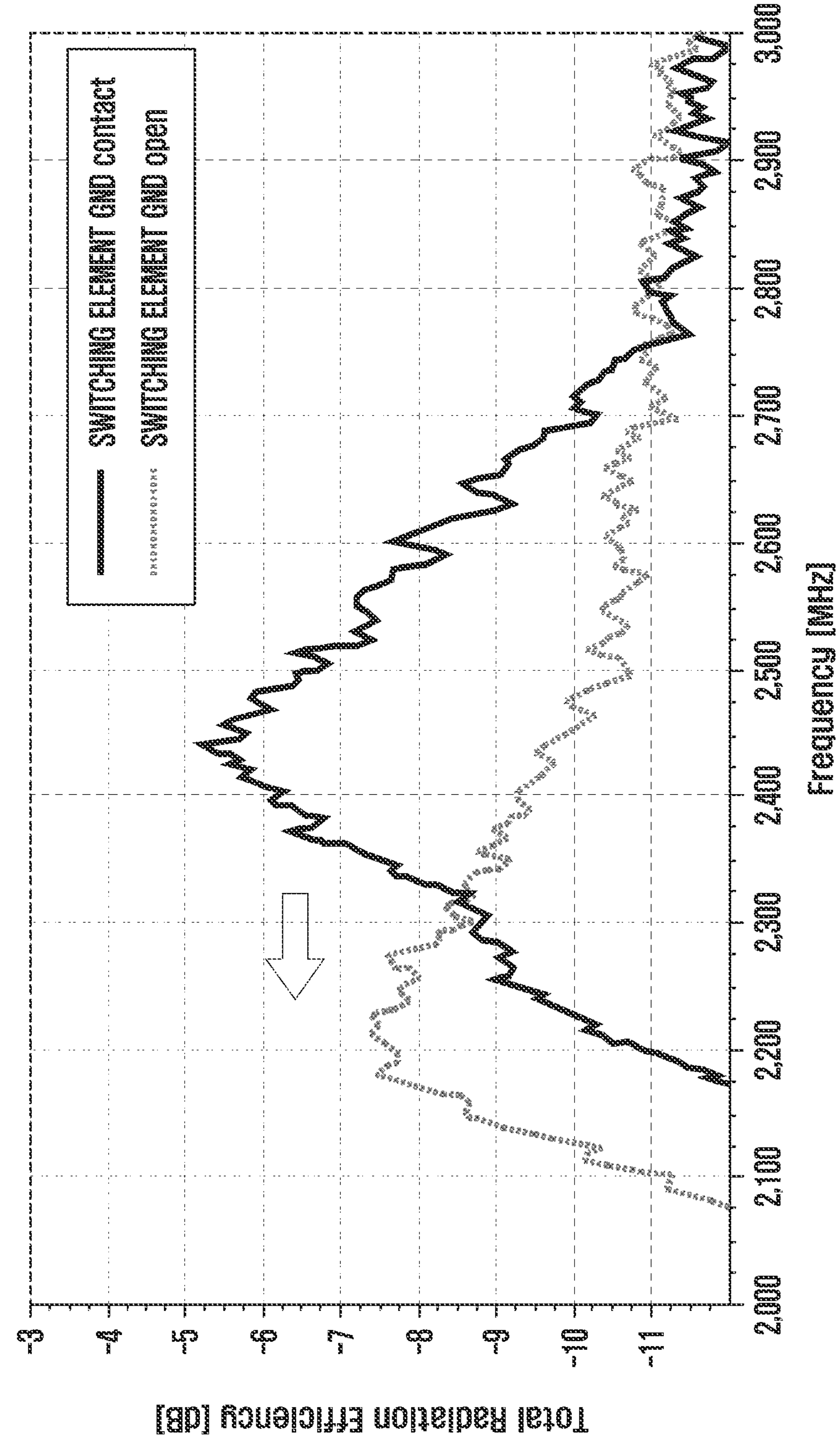
FIG. 7 is a graph illustrating a radiation efficiency of a first antenna according to an embodiment of the disclosure.

FIG. 7 is a graph illustrating a radiation efficiency of a first antenna according to an embodiment of the disclosure.

Referring to FIG. 7, a first antenna (e.g., the first antenna A1 in FIG. 5A) can shift the operating frequency band under the control of a switching element (e.g., the switching element 475 in FIG. 5A) that selectively and electrically connects a third connecting piece (the third connecting piece 4138 in FIG. 5A) to a second conductive layer (e.g., the second conductive layer 481 in FIG. 5A). In an embodiment, when the third connecting piece (the third connecting piece 4138 in FIG. 5A) is electrically connected to the second conductive layer (e.g., the second conductive layer 481 in FIG. 5A) of a PCB (e.g., the PCB 480 in FIG. 5A) through the switching element (e.g., the switching element 475 in FIG. 5A), the first antenna (e.g., the first antenna A1 in FIG. 5A) operates in the frequency band of about 2.4 GHz. In addition, when the third connecting piece (the third connecting piece 4138 in FIG. 5A) is electrically disconnected from the second conductive layer (e.g., the second conductive layer 481 in FIG. 5A) of the PCB (e.g., the PCB 480 in FIG. 5A) through the switching element (e.g., the switching element 475 in FIG. 5A), the first antenna is shifted to a frequency band of about 2.2 GHz.

Figure 8:
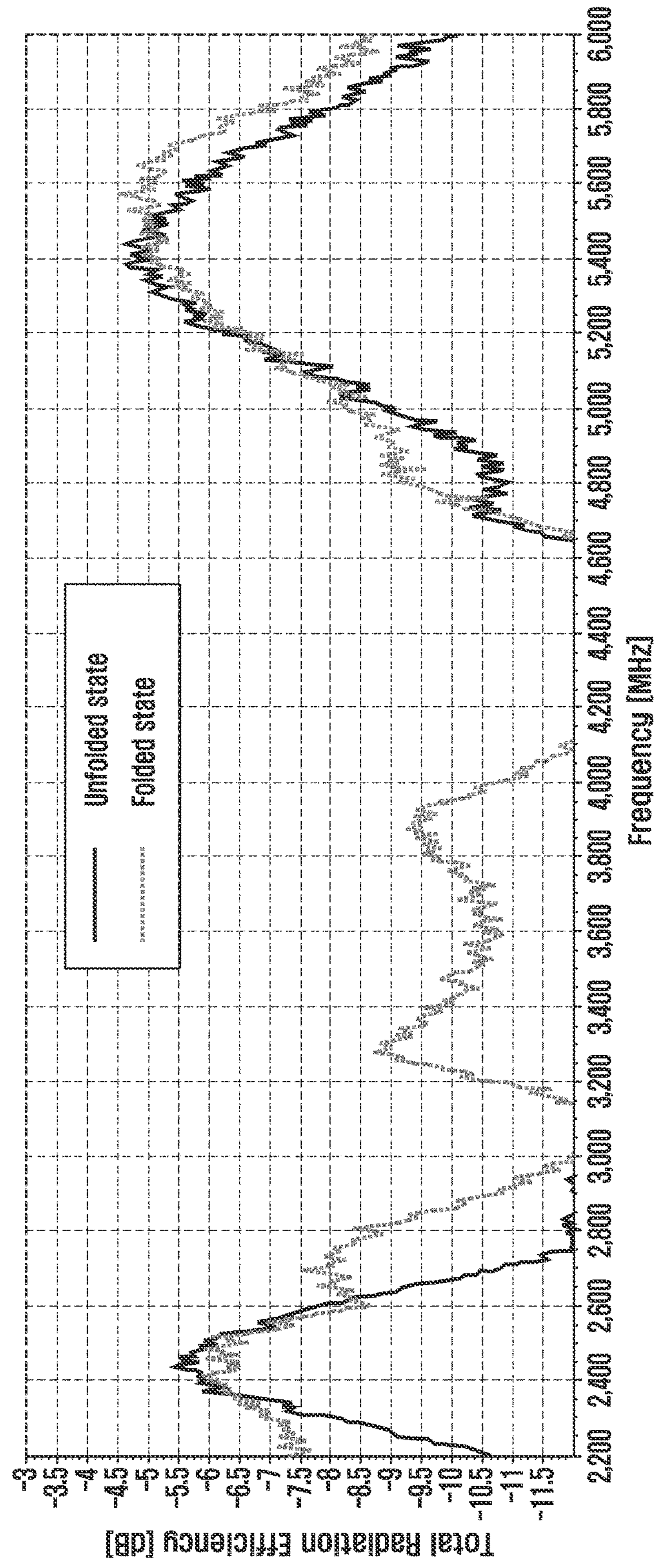
FIG. 8 is a graph illustrating a radiation efficiency of a first antenna when an electronic device illustrated in FIG. 5A is in a folded state or in an unfolded state according to an embodiment of the disclosure.

FIG. 8 is a graph illustrating a radiation efficiency of a first antenna when an electronic device illustrated in FIG. 5A is in a folded state or in an unfolded state according to an embodiment of the disclosure.

Referring to FIG. 8, it can be seen that the first antenna (e.g., the first antenna A1 in FIG. 5A) implemented as a slot antenna through an annular path (e.g., the annular path AP in FIG. 5A) using a hinge structure (e.g., the hinge structure 460 in FIG. 5A) has the substantially same radiation performance regardless of whether a first housing structure (e.g., the first housing structure 410 in FIG. 4) and a second housing structure (e.g., the second housing structure 420 in FIG. 4) are in the folded state or in the unfolded state.

Figure 9:
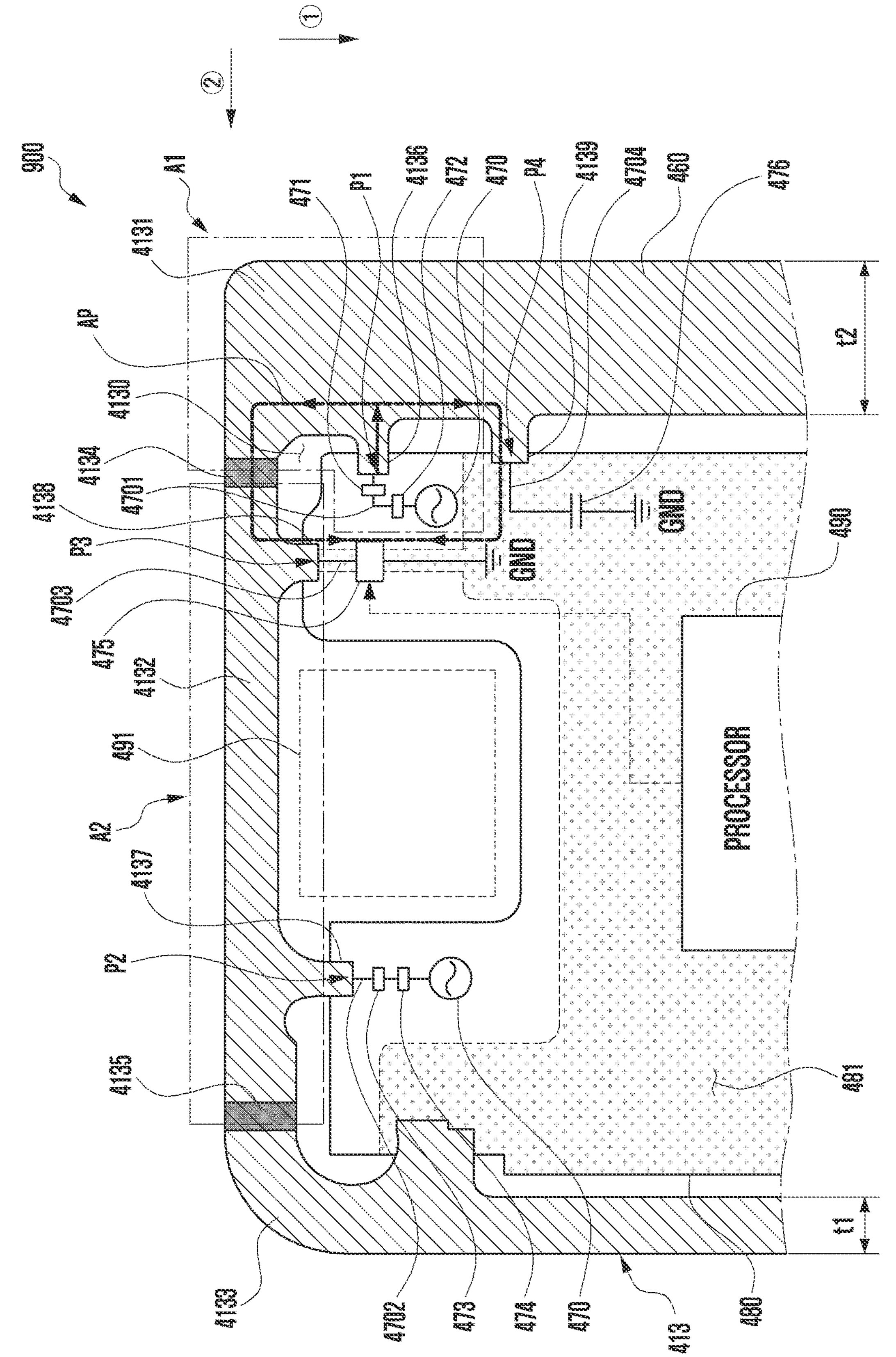
FIG. 9 is a view showing an arrangement relationship of antennas in an electronic device according to an embodiment of the disclosure.

FIG. 9 is a view illustrating an arrangement relationship of antennas in an electronic device according to an embodiment of the disclosure.

An electronic device of FIG. 9 may be similar, at least in part, to the electronic device 101 of FIG. 1 or the electronic device 200 of FIGS. 2A to 3, or may include other embodiments of the electronic device.

Referring to FIG. 9, an electronic device 900 is of a bar type and includes antennas A1 and A2 disposed in a conductive housing. The electronic device 900 has the substantially same configuration as the electronic device illustrated in FIG. 5A, so that descriptions thereof will be omitted.

As described above, in the foldable-type electronic device 400 of FIG. 5A, the antennas A1 and A2 are applied to an asymmetrical structure of the conductive lateral member 413 caused by the hinge structure 460. Similarly, the bar-type electronic device 900 illustrated in FIG. 9 includes the substantially same antennas A1 and A2 that operate using a slot area 4130 formed inside the conductive lateral member 413 having an asymmetrical left/right structure. Therefore, even though the thickness (t2) of the first conductive portion 4131 of the lateral member 413 is greater than the thickness (t1) of the third conductive portion 4133, the antennas A1 and A2 can operate to have a specified frequency through the inner slot area 4130.

As described hereinbefore, the electronic device according to various embodiments of the disclosure uses the conductive hinge structure as a part of the antenna. Therefore, a change in a design of the hinge structure according to the impedance matching is unnecessary, the radiation performance is maximized, and a shift to a desired operating frequency band is free.

According to various embodiments of the disclosure, an electronic device (e.g., the electronic device 400 in FIG. 4) may include a foldable housing, a flexible display (e.g., the display 430 in FIG. 4), at least one printed circuit board (PCB, e.g., the PCB 480 in FIG. 5A), and a wireless communication circuit (e.g., the wireless communication circuit 470 in FIG. 5A). The foldable housing includes a hinge structure (e.g., the hinge structure 460 in FIG. 4), a first housing structure (e.g., the first housing structure 410 in FIG. 4) connected to the hinge structure and including a first surface (e.g., the first surface 411 in FIG. 4) facing in a first direction (e.g., a positive direction of the Z-axis in FIG. 3), a second surface (e.g., the second surface 412 in FIG. 4) facing in a direction (e.g., a negative direction of the Z-axis in FIG. 3) opposite to the first direction, and a first lateral member (e.g., the first lateral member 413 in FIG. 4) surrounding a first space (e.g., the first space 4130 in FIG. 5A) between the first surface and the second surface, and a second housing structure (e.g., the second housing structure 420 in FIG. 4) connected to the hinge structure and including a third surface (e.g., the third surface 421 in FIG. 4) facing in a second direction (e.g., a positive direction of the Z-axis in FIG. 3), a fourth surface (e.g., the fourth surface 422 in FIG. 4) facing in a direction (e.g., a negative direction of the Z-axis in FIG. 3) opposite to the second direction, and a second lateral member (e.g., the second lateral member 423 in FIG. 4) surrounding a second space between the third surface and the fourth surface. The first lateral member includes a first conductive portion (e.g., the first conductive portion 4131 in FIG. 5A) extending along the hinge structure, a second conductive portion (e.g., the second conductive portion 4132 in FIG. 5A) extending substantially perpendicular to the first conductive portion, a third conductive portion (e.g., the third conductive portion 4133 in FIG. 5A) extending substantially parallel to the first conductive portion, a first non-conductive portion (e.g., the first non-conductive portion 4134 in FIG. 5A) connected between the first and second conductive portions, and a second non-conductive portion (e.g., the second non-conductive portion 4135 in FIG. 5A) connected between the second and third conductive portions. The first and second housing structures are foldable along the hinge structure such that the first surface faces the third surface in a folded state and the second direction is equal to the first direction in an unfolded state. The flexible display includes a first conductive layer that extends from the first surface to the third surface. The at least one PCB is disposed in the first space and includes a second conductive layer (e.g., the second conductive layer 481 in FIG. 5A) forming an annular path (e.g., the annular path AP in FIG. 5A) together with a part of the first conductive portion, the first non-conductive portion, and a part of the second conductive portion. The wireless communication circuit is disposed on the at least one PCB and electrically connected to a first point (e.g., the first point P1 in FIG. 5A) of the first conductive portion on the annular path and to a second point (e.g., the second point P2 in FIG. 5A) of the second conductive portion outside the annular path.

According to various embodiments, the hinge structure may include a conductive material.

According to various embodiments, at least a part of the hinge structure may be electrically connected to the first housing structure.

According to various embodiments, the electronic device may further include a switching element (e.g., the switching element 475 in FIG. 5A) electrically connected between the second conductive layer (e.g., the second conductive layer 481 in FIG. 5A) and a third point (e.g., the third point P3 in FIG. 5A) of the second conductive portion (e.g., the second conductive portion 4132 in FIG. 5A). The third point may be disposed closer to the first non-conductive portion (e.g., the first non-conductive portion 4134 in FIG. 5A) than the second point.

According to various embodiments, the wireless communication circuit may be configured to transmit and/or receive a first signal of a first frequency band through the first point and the annular path when the second conductive layer and the third point are electrically connected through the switching element.

According to various embodiments, the wireless communication circuit may be configured to transmit and/or receive a second signal of a second frequency band through the first point when the second conductive layer and the third point are electrically disconnected through the switching element.

According to various embodiments, the first frequency band may be relatively higher than the second frequency band.

According to various embodiments, the first conductive portion and the second conductive portion may be disposed at positions capacitively coupled to each other by the first non-conductive portion.

According to various embodiments, the second conductive layer may include a ground plane of the PCB, and the second conductive layer may be electrically connected to a fourth point (e.g., the fourth point P4 in FIG. 5A) of the first conductive portion.

According to various embodiments, the fourth point may be disposed farther from the first non-conductive portion than the first point.

According to various embodiments, the second housing structure may further include a third non-conductive portion (e.g., the third non-conductive portion 4234 in FIG. 4) and a fourth non-conductive portion (e.g., the fourth non-conductive portion 4235 in FIG. 4) which are disposed at positions facing the first and second non-conductive portions of the first housing structure, respectively, when the first and second housing structures are in a folded state.

According to various embodiments of the disclosure, an electronic device (e.g., the electronic device 400 in FIG. 4) may include a foldable housing, a display (e.g., the display 430 in FIG. 4), at least one printed circuit board (PCB, e.g., the PCB 480 in FIG. 5A), a wireless communication circuit (e.g., the wireless communication circuit 470 in FIG. 5A), a switching element (e.g., the switching element 475 in FIG. 5A), and at least one processor (e.g., the processor 490 in FIG. 5A). The foldable housing includes a conductive hinge structure (e.g., the hinge structure 460 in FIG. 4), a first housing structure (e.g., the first housing structure 410 in FIG. 4) connected to the hinge structure and including a first surface (e.g., the first surface 411 in FIG. 4) facing in a first direction (e.g., a positive direction of the Z-axis in FIG. 3), a second surface (e.g., the second surface 412 in FIG. 4) facing in a direction (e.g., a negative direction of the Z-axis in FIG. 3) opposite to the first direction, and a first lateral member (e.g., the first lateral member 413 in FIG. 4) surrounding a first space (e.g., the first space 4130 in FIG. 5A) between the first surface and the second surface, and a second housing structure (e.g., the second housing structure 420 in FIG. 4) connected to the hinge structure and including a third surface (e.g., the third surface 421 in FIG. 4) facing in a second direction (e.g., a positive direction of the Z-axis in FIG. 3), a fourth surface (e.g., the fourth surface 422 in FIG. 4) facing in a direction (e.g., a negative direction of the Z-axis in FIG. 3) opposite to the second direction, and a second lateral member (e.g., the second lateral member 423 in FIG. 4) surrounding a second space between the third surface and the fourth surface. The first lateral member includes a first conductive portion (e.g., the first conductive portion 4131 in FIG. 5A) extending along the hinge structure at least in part, a second conductive portion (e.g., the second conductive portion 4132 in FIG. 5A) extending from the first conductive portion, a third conductive portion (e.g., the third conductive portion 4133 in FIG. 5A) extending from the second conductive portion, a first non-conductive portion (e.g., the first non-conductive portion 4134 in FIG. 5A) connected between the first and second conductive portions, and a second non-conductive portion (e.g., the second non-conductive portion 4135 in FIG. 5A) connected between the second and third conductive portions. The first and second housing structures are foldable such that the first surface faces the third surface in a folded state and the second direction is equal to the first direction in an unfolded state. The display extends from at least a part of the first surface to at least a part of the third surface. The at least one PCB is disposed in the first space and includes a conductive layer (e.g., the conductive layer 481 in FIG. 5A) forming an annular path (e.g., the annular path AP in FIG. 5A) together with a part of the first conductive portion, the first non-conductive portion, and a part of the second conductive portion. The wireless communication circuit is disposed on the at least one PCB and electrically connected to a first point (e.g., the first point P1 in FIG. 5A) of the first conductive portion on the annular path and to a second point (e.g., the second point P2 in FIG. 5A) of the second conductive portion outside the annular path. The switching element is disposed on the PCB and selectively and electrically connected between the conductive layer and a third point (e.g., the third point P3 in FIG. 5A) of the second conductive portion so as to selectively form the annular path. The at least one processor controls the switching element to selectively determine the annular path according to state information of the electronic device.

According to various embodiments, at least a part of the hinge structure may be electrically connected to the first housing structure.

According to various embodiments, the third point may be disposed closer to the first non-conductive portion than the second point.

According to various embodiments, the wireless communication circuit may be configured to transmit and/or receive a first signal of a first frequency band through the first point and the annular path when the conductive layer and the third point are electrically connected through the switching element.

According to various embodiments, the wireless communication circuit may be configured to transmit and/or receive a second signal of a second frequency band through the first point when the conductive layer and the third point are electrically disconnected through the switching element.

According to various embodiments, the first frequency band may be relatively higher than the second frequency band.

According to various embodiments, the first conductive portion and the second conductive portion may be disposed at positions capacitively coupled to each other by the first non-conductive portion.

According to various embodiments, the conductive layer may include a ground plane of the PCB, and the conductive layer may be electrically connected to a fourth point (e.g., the fourth point P4 in FIG. 5A) of the first conductive portion.

According to various embodiments, the fourth point may be disposed farther from the first non-conductive portion than the first point.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
a flexible display;
a printed circuit board (PCB) including wireless communication circuitry disposed thereon;
a hinge structure including a conducive portion; and
a foldable housing including a first housing accommodating a first portion of the flexible display and the PCB, and a second housing accommodating a second portion of the flexible display, the first housing connected to the second housing via the hinge structure and including a first lateral portion, the first lateral portion forming a side portion of the first housing, the first lateral portion including:
a first conductive portion including a portion extending parallel to a folding axis of the hinge structure;
a second conductive portion extending perpendicular to the folding axis; and
a first non-conductive portion disposed between the first conductive portion and the second conductive portion,
wherein the first conductive portion is physically connected to the hinge structure, the first conductive portion comprising a first part extending parallel to the second conductive portion, and the first conductive portion comprising a first contact point via which the first conductive portion is electrically connected to the wireless communication circuit, and
wherein the second conductive portion forms a second part comprising a second contact point via which the second conductive portion is electrically connected to a ground area of the PCB.

2. The portable communication device of claim 1, wherein the first conductive portion includes a third contact point located further from the first non-conductive portion than the first contact point and electrically connected to the ground area of the PCB.

3. The portable communication device of claim 2, wherein the third contact point is located on the portion of the first conductive portion.

4. The portable communication device of claim 1, further comprising:
a third conductive portion including a portion extending parallel to the folding axis; and
a second non-conductive portion disposed between the second conductive portion and the third conductive portion,
wherein the first non-conductive portion is in contact with the first conductive portion and the second conductive portion,
wherein the second non-conductive portion is in contact with the second conductive portion and the third conductive portion, and
wherein the third conductive portion comprises a third part extending parallel to the second conductive portion.

5. The portable communication device of claim 4, wherein the second housing includes a second lateral portion forming a side surface of the second housing portion, the second lateral portion including:
a third non-conductive portion, and
a fourth non-conductive portion,
wherein when the foldable housing is fully folded, the third non-conductive portion and the fourth non-conductive portion are aligned with the first non-conductive portion and the second non-conductive portion, respectively.

6. The portable communication device of claim 4, wherein the first conductive portion comprises a corner portion located closer to the first non-conductive portion than to the second non-conductive portion, and
wherein the third conductive portion comprises another corner portion opposite to the corner portion with respect to the second conductive portion, the other corner portion being located closer to the second non-conductive portion than to the first non-conductive portion.

7. The portable communication device of claim 1, wherein an annular path for a signal is to be formed via at least a part of the first conductive portion, the first non-conductive portion, at least a part of the second conductive portion, and the ground area of the PCB.

8. The portable communication device of claim 7, wherein the wireless communication circuitry is configured to at least one of transmit or receive a first signal of a first frequency band through the first contact point and the annular path when a conductive layer of the flexible display and a third contact point are electrically connected through a switching element.

9. The portable communication device of claim 1, wherein the second conductive portion includes a fourth contact point that is located further from the first non-conductive portion than the second contact point and via which the second conductive portion is electrically connected to the wireless communication circuitry.

10. The portable communication device of claim 1, wherein, when viewed in a direction perpendicular to the first portion of the flexible display, a region of the first conductive portion physically connected with a conductive portion of the hinge structure overlaps with a part of the conductive portion of the hinge structure.

11. The portable communication device of claim 10, wherein at least part of the region of the first conductive portion forms a recess under which the conductive portion of the hinge structure is disposed.

12. The portable communication device of claim 1, wherein the first lateral portion includes a first side surface disposed in parallel with the folding axis, a second side surface extending from one end of the first side surface in a direction perpendicular to the folding axis, and a third side surface extending from another end of the first side surface in the direction perpendicular to the folding axis.

13. The portable communication device of claim 1, wherein the PCB comprises an electrical path configured to electrically connect, at the second contact point, a connecting piece to the ground area of the PCB.

14. The portable communication device of claim 13, wherein the connecting piece is configured to be electrically connected to the PCB through an electrical connection member.

15. The portable communication device of claim 14, wherein the electrical connection member is a C-clip or a conductive contact.

16. The portable communication device of claim 1, wherein the first lateral portion is configured to surround at least in part a first space between a first surface of the first housing and a second surface of the first housing.

17. The portable communication device of claim 1, wherein the ground area of the PCB is configured to operate as a ground plane being electrically connected to the first lateral portion.

18. A portable communication device comprising:

a display;

a printed circuit board (PCB) including wireless communication circuitry disposed thereon;

a hinge structure including a conducive portion; and a foldable housing including a first housing accommodating a first portion of the display and the PCB, and a second housing accommodating a second portion of the display, the first housing connected to the second housing via the hinge structure and including a first lateral portion, the first lateral portion forming a side portion of the first housing, the first lateral portion including:

a first non-conductive portion disposed on a first side of four sides of the first lateral portion perpendicular to a folding axis (axis-y) direction of the hinge structure;

a second non-conductive portion disposed between the first non-conductive portion and the hinge structure, on the first side of the first lateral portion;

a first conductive portion forming a first part of the first side between the first non-conductive portion and the second non-conductive portion, the first conductive portion including a first contact point located closer to the second non-conductive portion than to the first non-conductive portion and electrically connected to a ground area of the PCB; and a second conductive portion including a second part of the first side other than the first part and at least a part of a second side of the four sides parallel to the folding axis and forming a first corner portion of the first lateral portion closer to the second non-conductive portion than the first non-conductive portion, the second conductive portion physically connected to a conductive portion of the hinge structure and including a second contact point via which the second conductive portion is electrically connected to the wireless communication circuitry.

19. The portable communication device of claim 18, wherein the second conductive portion includes a third contact point located further from the second non-conductive portion than the second contact point and electrically connected to the ground area of the PCB.

20. The portable communication device of claim 19, wherein the third contact point is located on the second side.

21. The portable communication device of claim 18, further comprising a third conductive portion including a third part of the first side other than the first part and the second part and forming a second corner portion of the first lateral portion opposite to the first corner portion with respect to the first side.

* * * * *